(12) United States Patent
Inoue et al.

(10) Patent No.: US 6,354,086 B1
(45) Date of Patent: Mar. 12, 2002

(54) MANIFOLD INCORPORATING A THERMOELECTRIC MODULE AND A COOLING DEVICE USING THE THERMOELECTRIC MODULE

(75) Inventors: Hisayoshi Inoue, Osaka; Shohei Inamori, Shiga; Masatsugu Fujimoto, Osaka; Toshio Uetsuji, Osaka; Osao Kido, Kyoto, all of (JP)

(73) Assignee: Matsushita Refrigeration Company, Osaka (JP)

( * ) Notice: Subject to any disclaimer, the term of this patent is extended or adjusted under 35 U.S.C. 154(b) by 0 days.

(21) Appl. No.: 09/319,467

(22) PCT Filed: Oct. 5, 1998

(86) PCT No.: PCT/JP98/04496

§ 371 Date: Jul. 29, 1999

§ 102(e) Date: Jul. 29, 1999

(87) PCT Pub. No.: WO99/18399

PCT Pub. Date: Apr. 15, 1999

(30) Foreign Application Priority Data

Oct. 6, 1997 (JP) ............................................. 9-290404
Oct. 6, 1997 (JP) ............................................. 9-290405

(51) Int. Cl.[7] ............................................. F25B 21/02
(52) U.S. Cl. ............................ 62/3.2; 62/3.6; 417/420; 417/423.1
(58) Field of Search ................. 62/3.2, 3.6; 417/420, 417/423.1

(56) References Cited

U.S. PATENT DOCUMENTS

| | | | |
|---|---|---|---|
| 5,097,829 A | 3/1992 | Quisenberry | 128/400 |
| 5,232,516 A | 8/1993 | Hed | 136/204 |
| 5,263,829 A | 11/1993 | Gergets | 417/420 |
| 5,269,146 A | 12/1993 | Kerner | 62/3.6 |
| 5,465,581 A | 11/1995 | Haertl et al. | 62/50.1 |
| 5,540,567 A | 7/1996 | Schirpke et al. | 417/369 |
| 5,653,111 A | 8/1997 | Attey et al. | 62/3.7 |
| 5,675,973 A | 10/1997 | Dong | 62/3.6 |
| 5,683,231 A | 11/1997 | Nakazawa et al. | 417/420 |
| 5,692,885 A | 12/1997 | Langer | 417/420 |
| 6,056,520 A | 5/2000 | Nguyen et al. | 417/420 |

FOREIGN PATENT DOCUMENTS

| | | |
|---|---|---|
| JP | 50152204 | 12/1975 |
| JP | 1118193 | 8/1989 |
| JP | 51678 | 1/1993 |
| JP | 6504361 | 5/1994 |
| JP | 7234036 | 9/1995 |
| JP | 8236820 | 9/1996 |
| JP | 10500201 | 1/1998 |
| WO | 9213243 | 8/1992 |
| WO | 9531688 | 11/1995 |

*Primary Examiner*—William Doerrler
*Assistant Examiner*—Mark Shulman
(74) *Attorney, Agent, or Firm*—Wood, Phillips, VanSanten, Clark & Mortimer

(57) ABSTRACT

A manifold having such a built-in and round thermoelectric module that is capable of coming into an efficient contact with heat exchanging media, to afford an improved efficiency of heat exchange. The module easy to manufacture has a structure facilitating the multiplication of its thermoelectric elements. The manifold (1) generally consisting of a heating side section (2) and a cooling side section (3) has a cooling side agitator (5), a heating side agitator (6), the module (7) and a motor assembly (8), all incorporated in or attached to the manifold. The module has heat transfer upright faces (50,51) so that any bubbles coming into cavities (52,55) are allowed to ascend along the faces and then leave the manifold (1) through outlets (22,43) protruding from an upper portion of the manifold. Permanent magnets (33) accompanying the agitators (5,6) act to transmit torque from one of them (6) to the other (5). Square thermoelectric elements (111) are sandwiched between aluminum discs (112,113) to form a generally round module (120).

49 Claims, 19 Drawing Sheets

(a)  (b)

FIG. 17
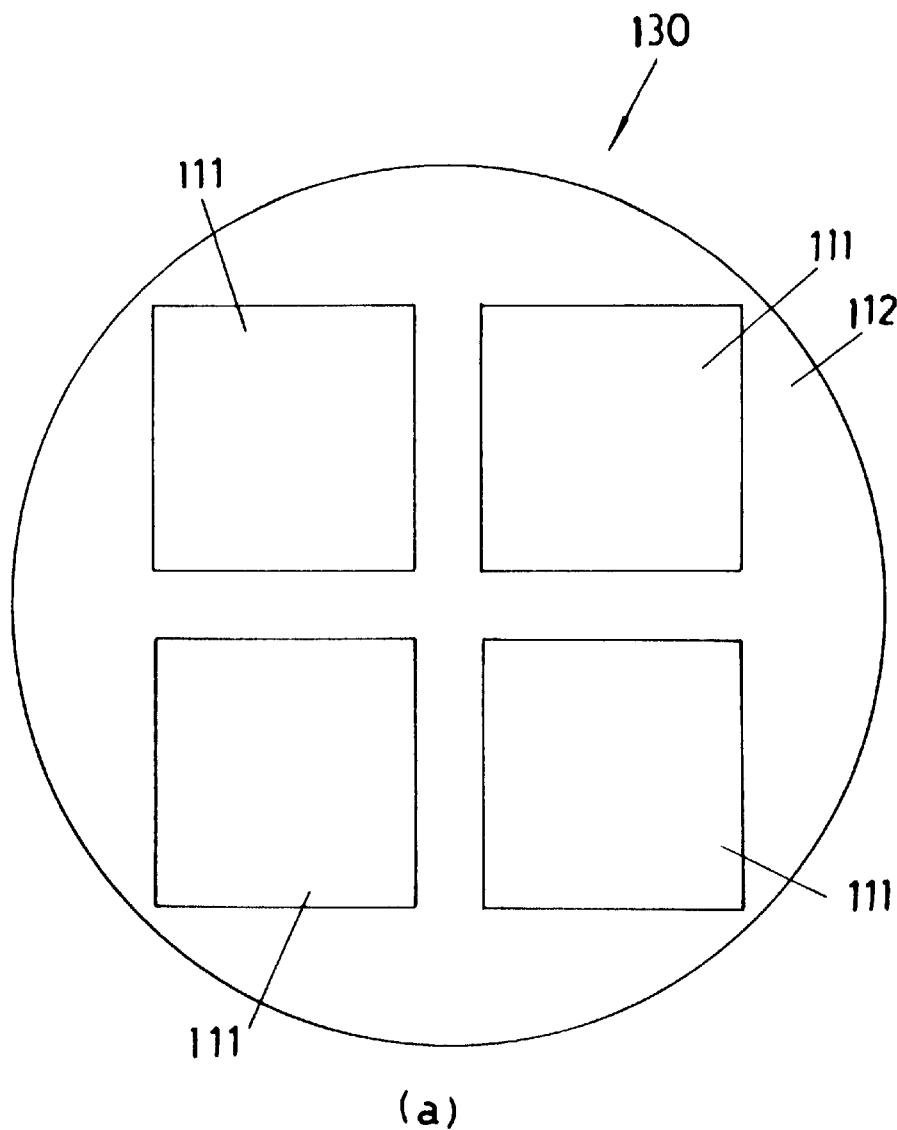
(a)
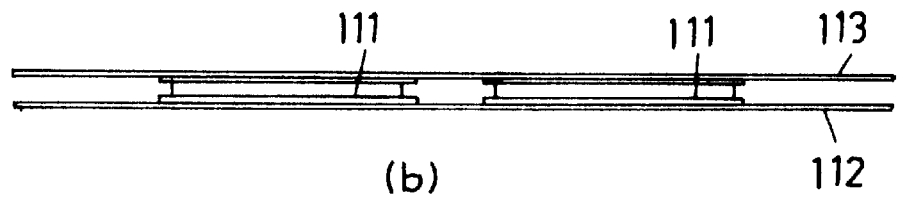
(b)

FIG. 18
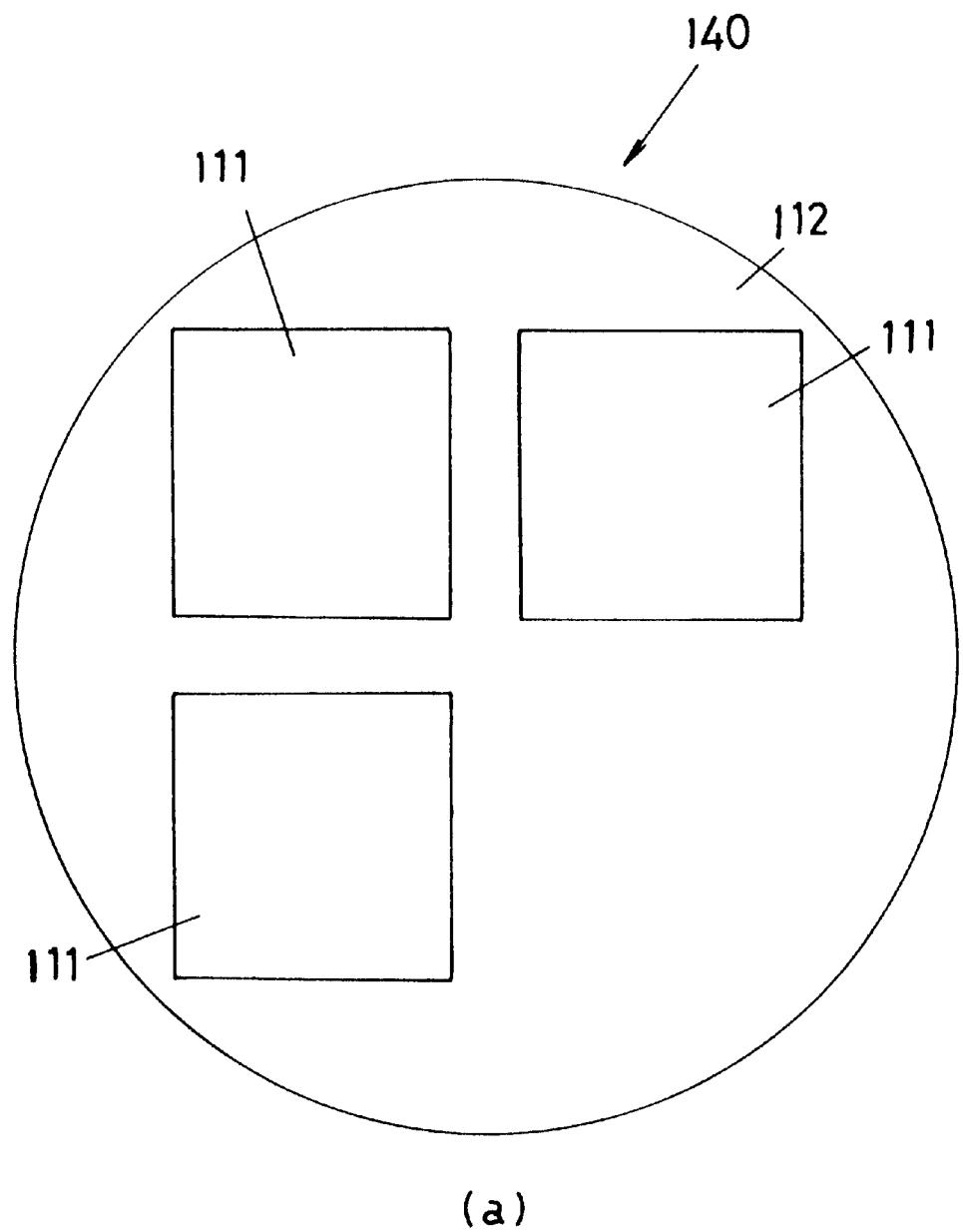
(a)
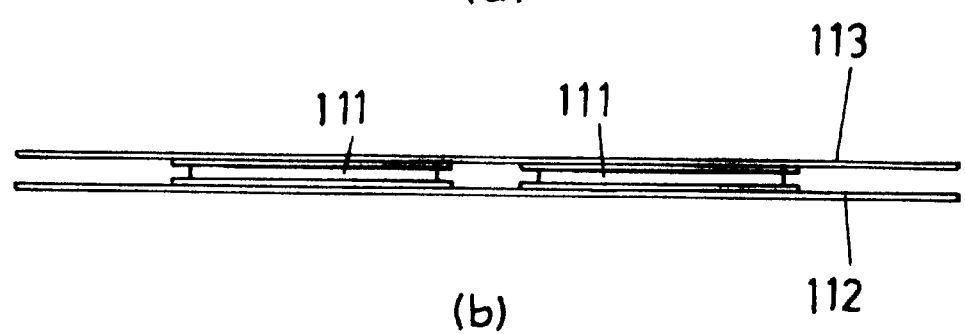
(b)

FIG. 19
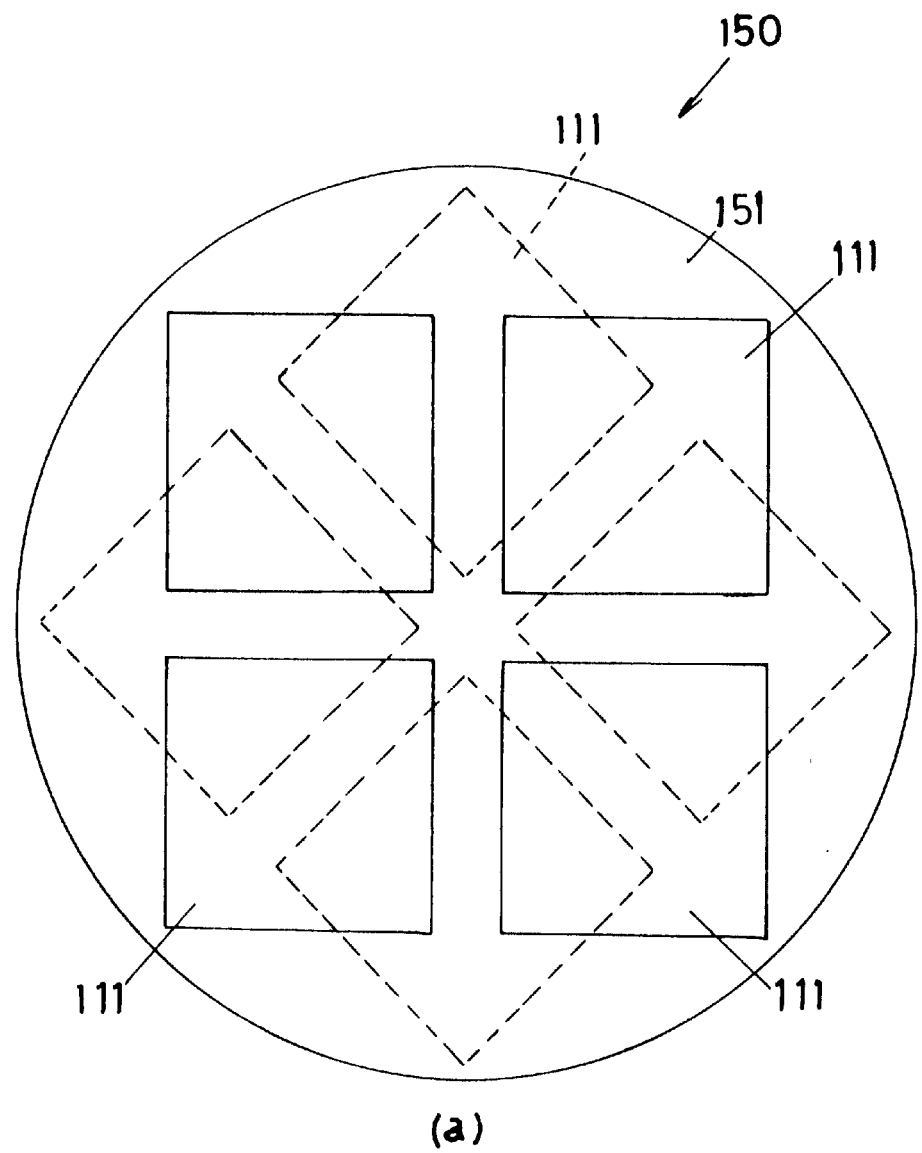
(a)
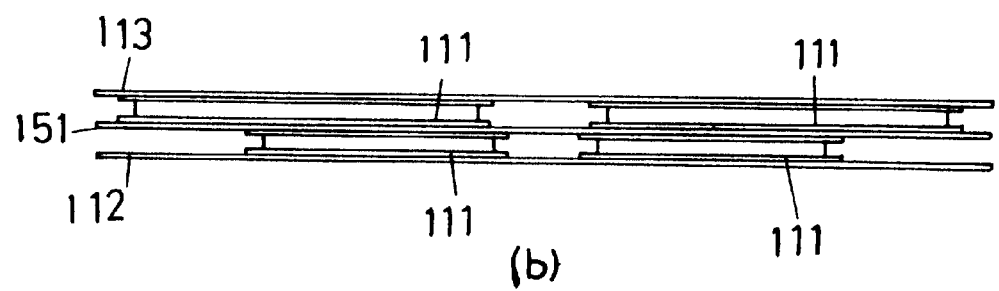
(b)

MANIFOLD INCORPORATING A THERMOELECTRIC MODULE AND A COOLING DEVICE USING THE THERMOELECTRIC MODULE

FIELD OF THE INVENTION

The present invention relates to a manifold with a built-in thermoelectric module. Further, the present invention relates to a cooling device having a thermoelectric module and also to the module itself.

BACKGROUND OF THE INVENTION

Recently, flon gases have been reported as the cause of the worldwide problem of ozonosphere destruction. Therefore, it has been required to develop as soon as possible new cooling devices or apparatuses operating without any flon gas. Among such devices or apparatuses that have been proposed, one that comprises a thermoelectric module is attracting attention in this field of industries.

Those thermoelectric modules are also known as Peltier modules and have each a pair of heat transfer faces or plates such that one of them will be heated, with the other being cooled, as an electric current is fed through them.

An example of the cooling devices using the thermoelectric modules is disclosed in the gazette "WO92/13243" (of International Patent Application No. PCT/AU92/00008).

The prior art shown in this gazette "WO92/13243" proposes a manifold having a thermoelectric module built therein in such a manner that two opposing cavities formed in the manifold is partitioned with said module. One of those cavities is in contact with one of the heat transfer faces that is being heated, wherein a closed circuit comprising a heat exchanger and a pump extends through the one cavity. Likewise, the other cavity in contact with the other transfer face being cooled communicates with another closed circuit also comprising a further heat exchanger and a further pump. Thus, two circulation systems are provided for heat exchanging media that may typically be water. One such system involves the heated face of the thermoelectric module, with the other system involving the cooled face thereof. The heat exchanger included in the latter system will work to cool down any desired foreign object, article or the like.

The prior art, that is the preceding invention shown in the gazette "WO92/13243", provides a practical cooling technology utilizing the thermoelectric module. However, since this invention merely teaches a basic structure of the cooling devices or apparatuses, some features or drawbacks of said structure have to be improved or resolved if and when it is applied to refrigerators or the like.

For example, those cooling devices of the thermoelectric module type are of a cooling efficiency lower than those of the known and conventional flon gas type.

In order to achieve a higher efficiency, the structure which the gazette "WO92/13243" has taught must be improved in respect of the structure of said module's heat transfer faces and the heat exchanging media kept in contact therewith.

Another gazette "WO95/31688" (of International Patent Application No. PCT/AU95/00271) discloses a further previous invention comprising a means for raising efficiency of heat exchange between the thermoelectric module and the heat exchanging media. This invention teaches agitators that are disposed in cavities formed in a manifold so as to increase effective contact areas of said media with the module.

It is however to be noted that any practical means for driving the agitators within the cavities is not proposed in the gazette "WO95/31688". Although the agitators installed in the cavities may be somewhat useful in resolving the problem discussed above, any suggestion on how to rotate the agitators is not given therein.

Those agitators in "WO95/31688" which will rotate anyhow to increase the effective contact areas of the module with the heat exchanging media is likely to produce bubbles in or bring bubbles into the cavities, undesirably resulting in less effective contact of said module with said media.

The thermoelectric module in "WO95/31688" is rendered round or circular in shape for the purpose of smooth rotation of the agitators within the manifold's cavities.

An example of such module employed in "WO95/31688" is of a structure or shape as shown herein in FIGS. 20 and 21.

FIG. 20 is a front elevation of the round thermoelectric module used in "WO95/31688", and FIG. 21 is a cross section of this module.

In FIGS. 20 and 21, the reference numeral 200 denotes a Peltier element, and the further numerals 202 and 203 respectively denote electrodes and aluminum plates. As seen in these figures, the prior art round module consists of the Peltier element 200 and the electrodes 202 arranged generally to form a circular configuration, wherein those element is sandwiched between discs together with the electrodes.

The known structure disclosed in "WO95/31688" may possibly render it possible to make a circular thermoelectric module. However, it is not easy to commercially manufacture modules of such a conventional structure. More specifically, it is difficult to position the Peltier element 200 and those electrodes 202 within a generally round contour that these members have to assume as a whole.

It also is difficult to stack several Peltier elements one on another in a laminating fashion according to the prior art structure, even if such a composition might produce much lower temperatures.

In addition, the prior art cooling apparatus of the described thermoelectric module type has required certain pumps to circulate the heat exchanging media.

It is known in the art to employ a certain transmission of magnet type in order to drive the pumps for circulating the heat exchanging media (see "WO94/18516").

The present invention, that was made in view of the problems inherent in the described prior art, does hereby propose a quite novel manifold whose built-in thermoelectric module can be kept well in an excellent contact with heat exchanging media so as to afford an improved efficiency of heat exchange.

Further, the present invention provides a newly developed circular thermoelectric module that is not only easy to manufacture but also is suited for laminated composition.

DISCLOSURE OF THE INVENTION

The present invention made to diminish the drawbacks in the prior art provides a manifold comprising a built-in thermoelectric module that has at least two heat transfer faces such that one of the faces is heated and the other face is cooled when an electric current is applied to the module, a manifold body covering at least one of the heat transfer faces and defining a cavity between the one face and the body, a medium inlet through which a heat exchanging medium flows into the cavity, and a medium outlet through which the medium flows out of said cavity, wherein the heat transfer faces of the thermoelectric module stands upright and the medium outlet is disposed in an upper region of the cavity.

Thus, the manifold of the present invention has the inlet and outlet formed for the heat exchanging medium to flow into and out of the cavity, with the thermoelectric module being disposed vertically and with the outlet being located in an upper region of said cavity. By virtue of this feature, any bubbles that might be entrained into the cavity will rise along the upright heat transfer faces. Those bubbles or air will then be discharged quickly through the outlet at the top of the cavity. Such a smooth discharge of bubbles contributes to better contact of the medium with the module's faces, thereby affording a higher efficiency of heat exchange.

Preferably, the medium outlet may be slanted somewhat.

Such an oblique outlet which the manifold comprises will assist the bubbles to smoothly move away from the manifold.

Also preferably, agitators are disposed rotatably in the cavity.

From another aspect, the present invention made to resolve the drawbacks in the prior art provides a manifold comprising a built-in thermoelectric module that has at least two heat transfer faces such that one of the faces is heated and the other face is cooled when an electric current is applied to the module, a manifold body covering at least one of the heat transfer faces and defining a cavity between the one face and the body, a (first) agitator disposed in the at least one cavity and having a (first) shaft, a pump accompanied by the manifold and having a (second) agitator and a (second) shaft, with the shafts extending in alignment with each other, rotors respectively connected to the agitators, and a single stator surrounding both the rotors so that the stator and the rotors form a motor capable of rotating the (first) agitator in the cavity together with the (second) agitator of the pump.

In the manifold of this structure and having the built-in thermoelectric module, the single stator and the two rotors constitute the motor such that said rotors drive the agitator in the cavity together with the agitator of the pump. Therefore, the manifold is rendered integral with the pump and accordingly the number of necessary parts is reduced.

The manifold just discussed above is so constructed that the cavity per se will serve as another pump.

In one of preferable modes of the invention, the manifold body covers the thermoelectric module such that one cavity is provided beside the heated face of said module and within the body, with the other cavity likewise provided beside the cooled face. The agitators are installed in the respective cavities, and a transmission is provided for them to transmit torque of the one agitator in the one cavity to the other agitator in the other cavity so as to rotate them within the respective cavities.

From still another aspect, the present invention provides a manifold comprising a built-in thermoelectric module that has at least two heat transfer faces such that one of the faces is heated and the other face is cooled when an electric current is applied to the module, a manifold body covering the module so that one cavity is formed beside the heated face of said module and within the body, with the other cavity likewise formed beside the cooled face, agitators installed in the respective cavities, a driving means for rotating one of the agitators, and a transmission for transmitting torque of the one agitator to the other agitator so that as the one agitator is driven within the one cavity, the other agitator receives torque from the one agitator so as to rotate within the other cavity.

In the manifold of this structure, the heat exchanging media flow each in a circle within each cavity to thereby improve contact coefficient of the media contacting the module's heat transfer faces, thus raising efficiency of heat exchange.

The single driving means can drive both the agitators located on respective sides of the heated and cooled faces of the module built in the manifold, whereby the number of constituent parts is reduced and the overall outer size of the manifold is decreased.

The agitators rotating within the respective cavities also contributes to efficient contact of the media with the module's faces and thus affords a higher efficiency of heat exchange.

Desirably, transmission of force between the agitators may rely on magnetic mechanism.

In such a manifold having the built-in module, force or torque will be transmitted magnetically between the agitators. This non-contact type transmission is advantageous in that the cavities are insulated from each other and consequently one of the media being heated is protected from mixing with the other medium being cooled.

It also is desirable that outer dimension of the cavities is greater than that of the module's heat transfer faces so that magnetic pieces constituting the magnetic transmission mechanism are fixed on agitators' regions confronting the portion along and outside the periphery of the module.

The magnetic pieces or members employed in this structure are located along and outside the periphery of the thermoelectric module. In other words, magnetic pieces are apart from the module so as to protect the latter from magnetic influence.

In an alternative mode, a common shaft penetrates both the cavities so that torque of one agitator is transmitted by and through this shaft to the other agitator.

The manifold of this structure is advantageous in that power is directly transmitted from one agitator to the other, giving a higher efficiency of transmission.

The driving means mentioned above may generally be an electric motor, and a rotor of this motor will operatively be connected to one of the agitators. Preferably, the magnetic center line of the motor's rotor is not in alignment with the magnetic center line of the stator mentioned above, and this line is offset rearwardly of the agitators.

It is preferable that the thermoelectric module repeatedly discussed above is of a circular contour.

Such a round configuration will diminish futile peripheral portions of the module built in the manifold.

Further, the module may consist of an element molded as a plate and a pair of heat conductive discs sandwiching same.

This plate-shaped module can substantially serve as a round thermoelectric module.

In another alternative mode, a plurality of Peltier elements are arranged and fixed in position to form a rectangular envelope to provide a rectangular thermoelectric element, and the latter is sandwiched by and between two or more discs.

Such an arrangement of the Peltier elements to form a rectangular group disposed between the two or more discs provides a rectangular or square composite module.

This module will generally have a round appearance.

The module of this substantially round type is easy to manufacture and suited to laminate Peltier elements with each other.

The rectangular thermoelectric element referred to above may preferably be prepared by sandwiching same with and between ceramics layers or aluminum oxide layers.

Further, those rectangular elements may be stacked one on another so as to produce much lower temperatures.

Additionally, those rectangular elements can also be arranged side by side and sandwiched between discs to provide a round composite module of a larger surface area. It is desirable that the discs noted above are of a rough outer surface adapted to enhance efficiency of heat exchange.

All the alternative thermoelectric modules summarized above and applicable to any mode of the present invention have not been known in the art.

The manifold body or casing may cover only one heat transfer face of the module, with the other face being secured to any appropriate heat conductive plate.

The manifold of this structure may be used to directly cool any ambient article or air by means of such a conductive plate.

From a further aspect of the invention, provided herein is a manifold comprising rectangular thermoelectric element in which a plurality of Peltier elements are arranged and which is sandwiched between discs so as to provide a generally round module, the round module having two heat transfer faces such that one of the faces is heated and the other face is cooled when an electric current is applied to the module, a manifold body covering the module so that one cavity is formed beside the heated face of said module and within the body, with another cavity being likewise formed beside the cooled face, the manifold body or casing having a medium inlet through which the medium flows into each cavity as well as a medium outlet through which the medium flows out of each cavity, wherein the heat transfer faces of the thermoelectric module stands upright and the medium outlet is disposed in an upper region of the cavity, agitators installed in each cavity, a transmission for magnetically transmitting torque of the one agitator to the other agitator, a pump secured to the manifold body and having further agitator with a shaft in alignment with a further shaft of the agitator, separate rotors connected to the agitator in the cavity and to the agitator of the pump, a stator surrounding both the rotors so that the stator and the rotors form a motor and when the agitator in one cavity as well as the agitator of the pump are driven the other agitator in the other cavity magnetically receives torque from the one agitator thus rotating within the one cavity.

Each of the described manifolds described hereinbefore and provided with the built-in thermoelectric modules is useful to construct a cooling apparatus. A piping will be connected to and between the manifold and an external heat exchanger so as to form a loop for the cooling apparatus.

In detail, the cooling apparatus provided herein does comprise manifold having a built-in thermoelectric module, an external heat exchanger and a loop-shaped piping connected to and extending between the manifold and the heat exchanger, wherein the manifold comprises at least two heat transfer faces such that one of the faces is heated and the other face is cooled when an electric current is applied to the module, a manifold body covering the module so that one cavity is formed beside the heated face of said module and within the body, with another cavity likewise formed beside the cooled face, agitators installed in the respective cavities, a driving means for rotating one of the agitators, and a transmission for transmitting torque of the one agitator to the other agitator so that as the one agitator is driven within the one cavity, the other agitator receives torque from the one agitator and rotates within the other cavity, and at least one of the agitators force the heat exchanging medium in the manifold to flow into and circulate through the piping.

It is noted here that the manifold comprising the built-in module has the agitators that are disposed in the cavities and urge the heat exchanging medium to circulate within the system, thus dispensing with any pump.

The manifold just referred to above may be replaced with another type of manifold also comprising a built-in thermoelectric module that has at least two heat transfer faces such that one of the faces is heated and the other face is cooled when an electric current is applied to the module, a manifold body covering at least one of the heat transfer faces and defining a cavity between the one face and the body, a (first) agitator disposed in the at least one cavity and having a (first) shaft, a pump accompanied by the manifold and having a (second) agitator and a (second) shaft, with the shafts extending in alignment with each other, rotors respectively connected to the agitators, and a single stator surrounding both the rotors so that the stator and the rotors form a motor capable of rotating the (first) agitator in the cavity together with the (second) agitator of the pump.

Alternatively, the manifold just referred to above with respect to the cooling apparatus may be replaced with another type of manifold also comprising a built-in thermoelectric module that has at least two heat transfer faces such that one of the faces is heated and the other face is cooled when an electric current is applied to the module, a manifold body covering at least one of the heat transfer faces and defining a cavity between the one face and the body, a medium inlet through which a heat exchanging medium flows into the cavity, a medium outlet through which the medium flows out of said cavity, and an agitator disposed and rotating in the cavity, wherein the heat transfer faces of the thermoelectric module stands upright and the medium outlet is disposed in an upper region of the cavity.

BRIEF DESCRIPTION OF THE DRAWINGS

FIG. 17(a) is a front elevation of the module installed in the manifold of the eighth embodiment (with the module illustrated without a disc 113);

FIG. 17(b) is a cross section of the module of FIG. 17(a) and shown together with the disc 113;

FIG. 18(a) is a front elevation of the module installed in the manifold of a ninth embodiment (with the module illustrated without a disc 113);

FIG. 18(b) is a cross section of the module of FIG. 18(a) and shown together with the disc 113;

FIG. 19(a) is a front elevation of the module installed in the manifold of a tenth embodiment (with the module illustrated without a disc 113);

FIG. 19(b) is a cross section of the module of FIG. 19(a) and shown together with the disc 113;

BEST MODES OF CARRYING OUT THE INVENTION

Figure 1:
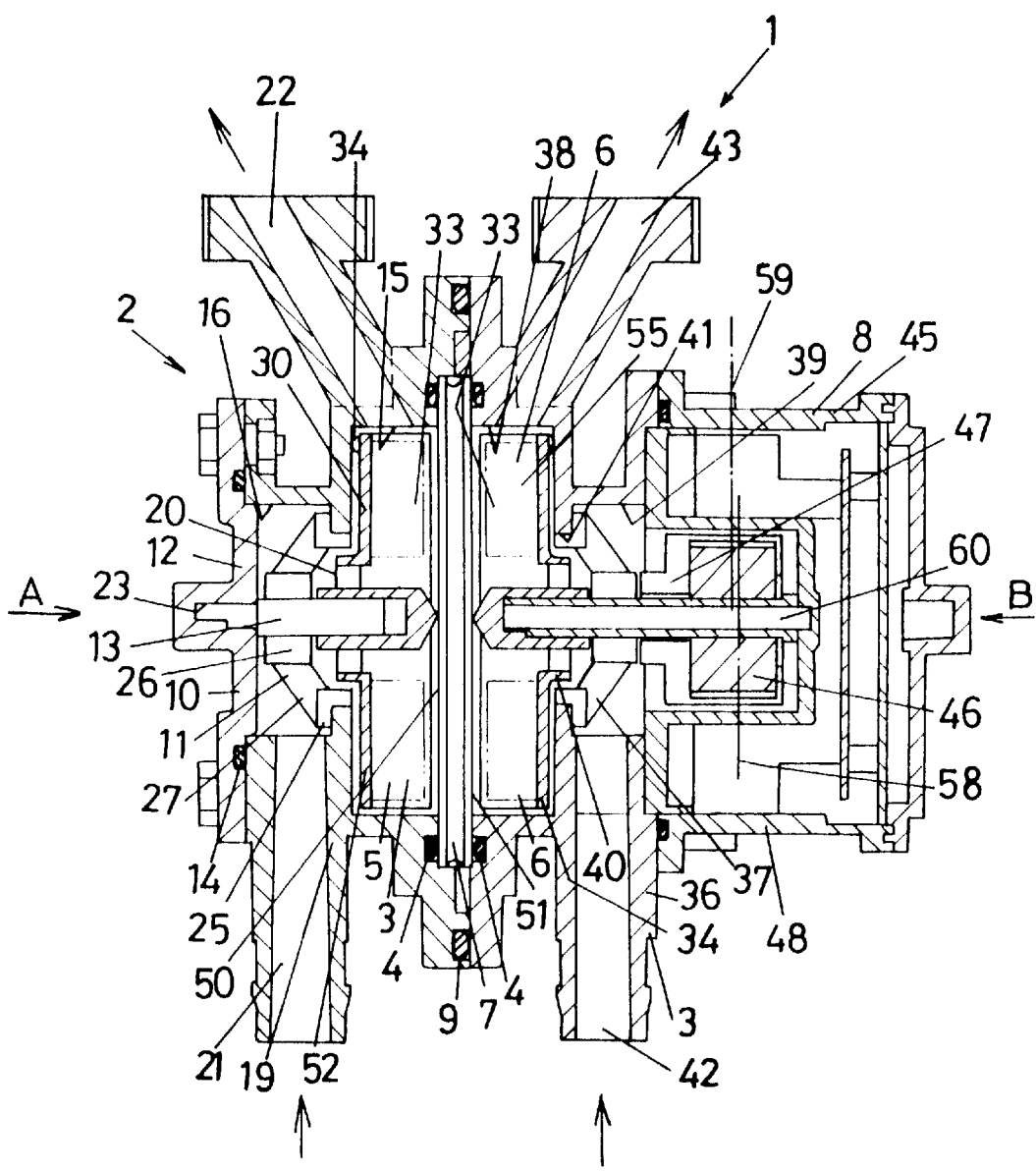
FIG. 1 is a cross-sectional front elevation of a manifold having a built-in thermoelectric module and provided in a first embodiment of the present invention.
Figure 2:
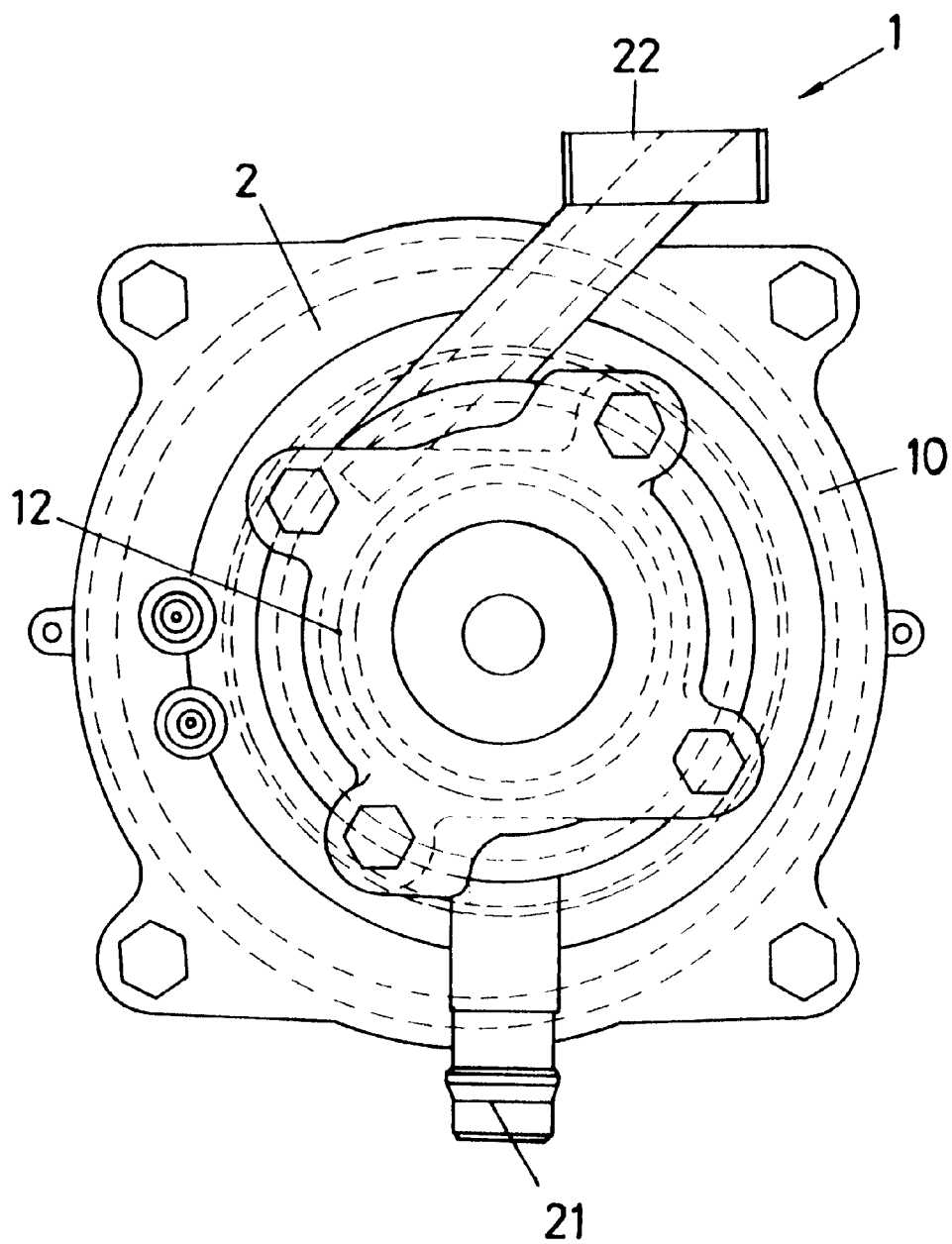
FIG. 2 is a side elevation of the manifold seen in the direction of the arrow 'A' in FIG. 1.
Figure 3:
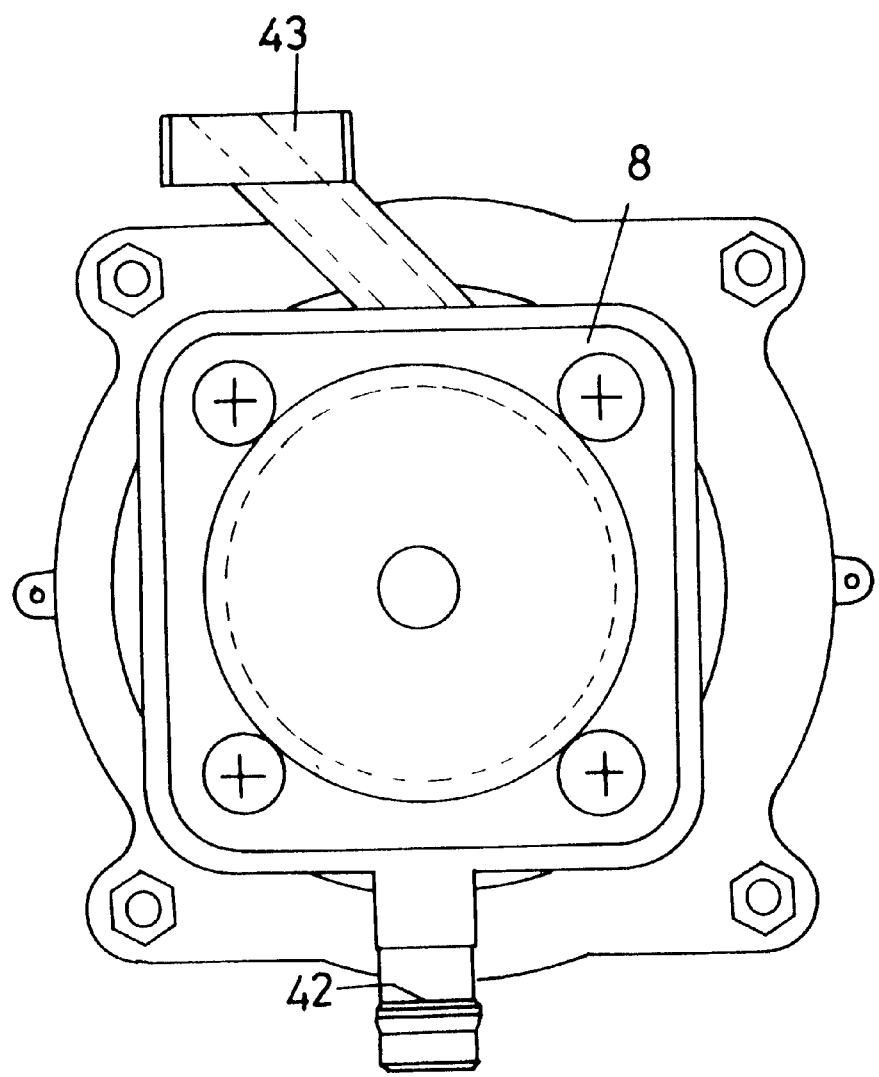
FIG. 3 is another side elevation of the manifold seen in the direction of the arrow 'B' in FIG. 1.

Now, the best modes of carrying out the present invention will be described below in detail and making reference to the accompanying drawings.

FIRST EMBODIMENT

A first embodiment is illustrated in FIGS. 1 to 9.

The reference numeral 1 in FIGS. 1 to 9 generally denotes a manifold that has a built-in thermoelectric module employed in the first embodiment. The manifold 1 generally consists of a cooling side section 2, a heating side section 3, a cooling side agitator 5, a heating side agitator 6, a thermoelectric nodule 7 and a motor assembly 8.

Figure 4:
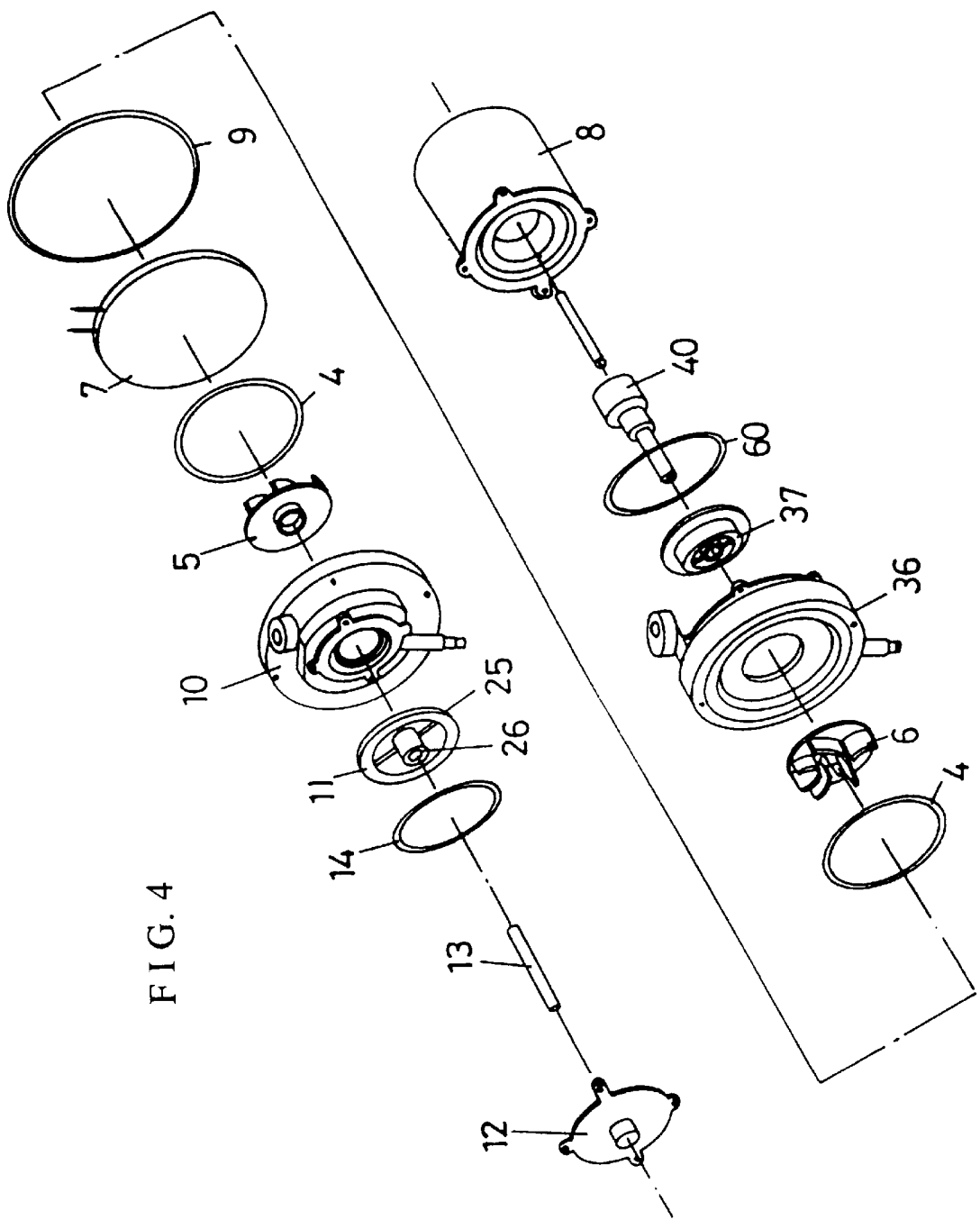
FIG. 4 is an exploded perspective view of the manifold shown in FIG. 1.
Figure 5:
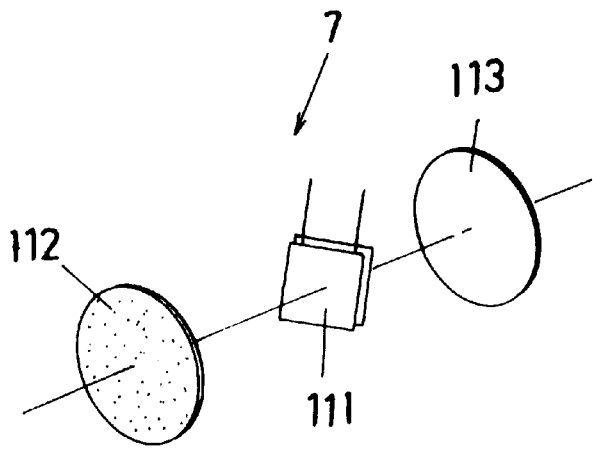
FIG. 5 is an exploded perspective view of the thermoelectric module incorporated in the module shown in FIG. 4.

As seen in FIGS. 1 and 4, the cooling side section 2 consists of a manifold body 10, a shaft holder 11, a lid 12, a shaft 13 and a seal 14. The manifold body 10 has a disc-shaped portion and a boss-shaped portion formed integral therewith.

A round recess 15 is formed in the disc-shaped portion of the manifold body 10. Similarly, a round or cylindrical recess 16 is formed in the boss-shaped portion. A partition 19 disposed between the recesses 15 and 16 has a bore 20 such that these recesses communicate with each other through the bore 20.

A short cylindrical inlet 21 secured to the boss-shaped portion allows a fluid to flow into this portion. A similar short cylindrical outlet 22 secured to the disc-shaped portion allows the fluid to flow out of the interior of this portion. The outlet 22 is slanted, and preferably extends tangentially of the recess 15 as seen in the drawings.

Both the inlet 21 and outlet 22 in the embodiment extending in fixed directions are located at bottom and top, respectively. Thus, the inlet 21 vertically faces downwards, with the outlet 22 obliquely facing upwards. This arrangement is common in other embodiments that will be described below.

The lid 12 mentioned above stops an opening of the recess 16 formed in the manifold body 10 and has a blind central hole 23 for receiving the shaft.

The shaft holder 11 consists of a rim 25, a boss 26 surrounded thereby and spokes 27 connecting the rim to the boss. There are present several openings between those rim and boss, and the latter has a bore. The cooling side agitator 5 is a stirrer that comprises five vanes 31 fixed on one side of a disc 30). Each vane 31. that has a narrower inner or centripetal region continuing to a broader outer or peripheral region in front-elevational view (see FIG. 7). Those vanes 31 curved counterclockwise have their leading edges gradually protruding more and more towards their peripheral ends in a direction of their rotation, in an ascending manner.

The vanes forming the cooling side agitator 5 need not necessarily be of that shape which has just detailed above, but may be windmill-shaped, propeller-shaped or may be simple rectangular planes fixed on and standing upright from a disc.

A permanent magnet 33 of a cubic shape is embedded in each vane 31, in the present embodiment.

Small lugs 34 distributed along the periphery of the disc 30 are attached to a back side thereof.

The heating side manifold section 3 of a shape and structure similar to that of the cooling side one thus comprises a manifold body 36 and a shaft holder 37. Configuration of this body 36 is a reflected image (viz., mirror image) of that which the cooling side manifold body 10 has. A disc-shaped portion and a boss-shaped portion of said body 36 have also recesses 38 and 39 both round in cross section, and a partition 40 between these portions has a bore 41. An inlet 42 and an outlet 43 are secured to the boss-shaped and disc-shaped portions, respectively.

The shaft holder 37 is of the same shape as that of the cooling side shaft holder.

Also, the heating side agitator 6 is of the same structure as that of cooling side.

The motor assembly 8 comprises a casing 45 and a rotor 46, and the casing is of a double cylinder shape so that a cylindrical central chamber 47 is provided. This chamber 47 is liquid-tightly insulated from the interior of the casing 45 in which an induction coil as a stator 48 is accommodated.

The rotor 46 is made of a permanent magnet, which in this embodiment is composed of magnetic particles blended with and distributed throughout the mass of a suitable plastics.

The thermoelectric module 7 used in this embodiment is disc-shaped and composed of a rectangular thermoelectric element 111 fixedly gripped by and between a pair of aluminum discs 112 and 113.

Figure 6:
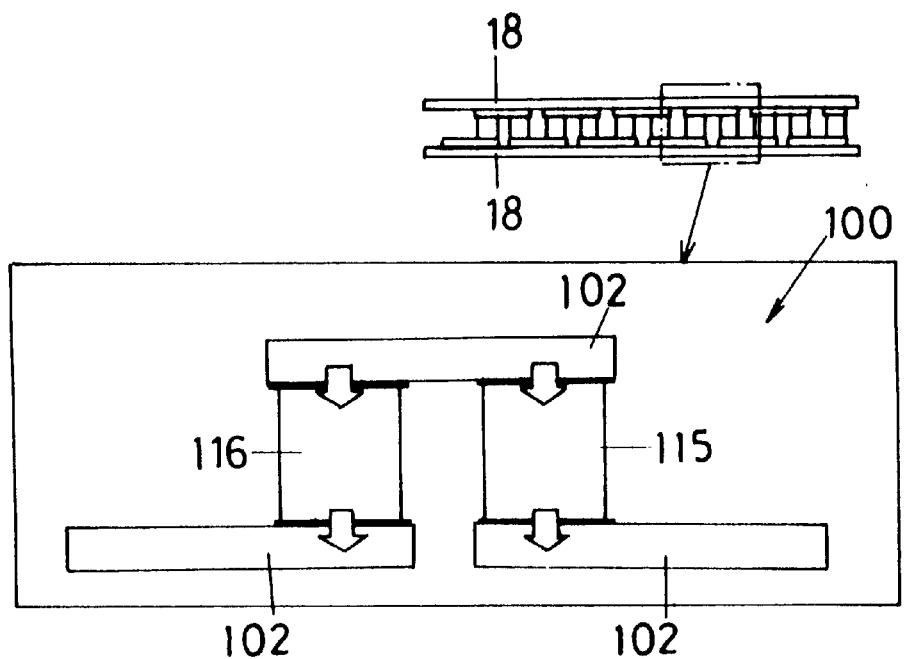
FIG. 6 is a cross section of the module of a rectangular type.
Figure 7:
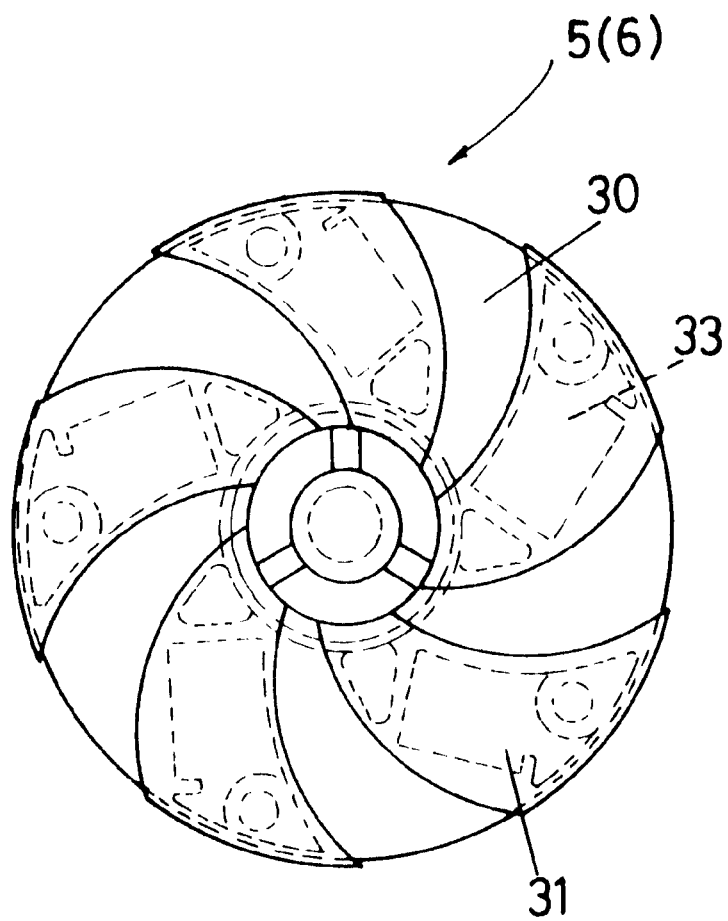
FIG. 7 is a front elevation of an agitator installed in the manifold of FIG. 1.
Figure 8:
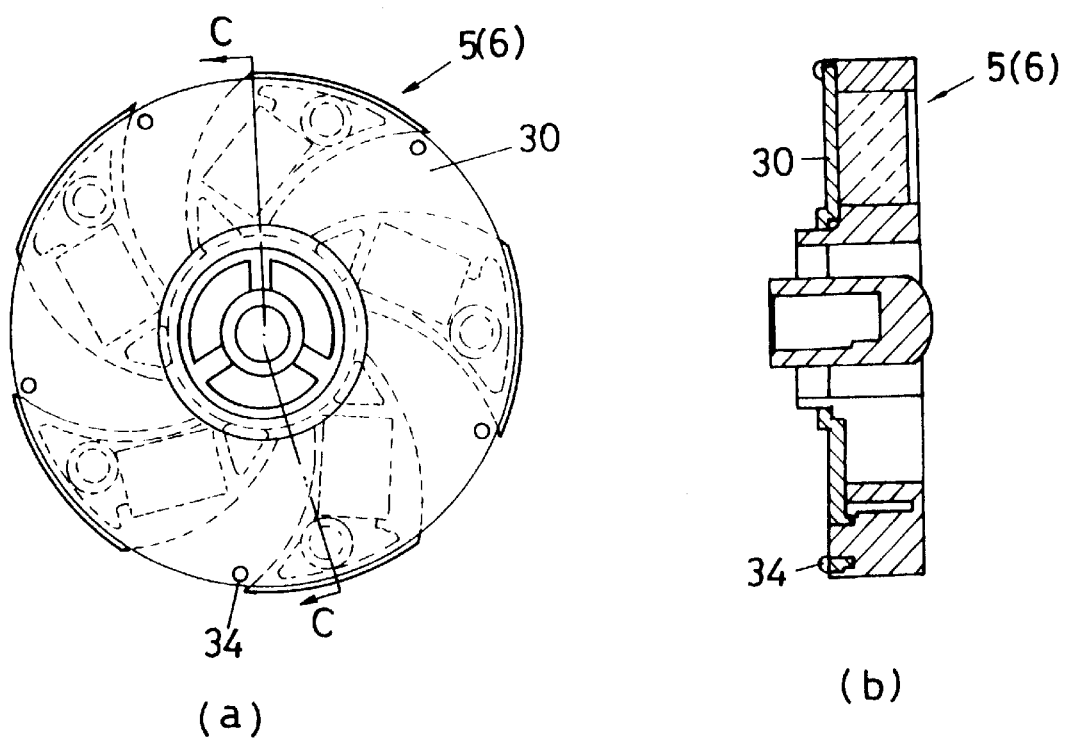
FIG. 8 is a rear elevation of the agitator shown in FIG. 7 and a cross section taken along the line C—C.

A Peltier element known in the art and used herein as the element 111 comprises a number of n-type semiconductors and a number of p-type semiconductors. As will be seen in FIG. 6 showing the cross section of the element 111, every two adjacent ones of staggered electrodes 102 that are arranged in an upper row and lower row are electrically connected to each p-type and n-type thermoelectric semiconductors 115 and 116. Thus, all the semiconductors are connected in series to each other between a pair of insulating plates 18 made of a suitable ceramics and covering the electrodes. It will however be understood that a minimum unit of such a Peltier element is a couple of one p-type semiconductor 115 and one n-type semiconductor 116. Usually, a solder will be use to connect those semiconductors to the electrodes.

Any appropriate type of the known adhesives may be utilized to bond the discs 112 and 113 to such an element 111.

It is desirable to roughen the outer surface of each disc 112 and 113, though may be smooth. Roughness of or greater than 20 micrometers is recommended herein to ensure effective contact of said discs with the heat exchanging media. An upper limit of roughness is 1 mm or less, depending on thickness of those discs.

A positioning notch or cutout (not shown) is formed in each disc 112 and 113.

Details in structure of the manifold I will now be described. The cooling side section 2 is combined with the heating side section 3, with an O-ring 9 being interposed therebetween. The thermoelectric module 7 is disposed centrally of the manifold, and its periphery bears against other O-rings 4 held in facing peripheral zones of the manifold sections. The motor assembly 8 is attached to the outer surface of the heating side section 3.

Structure of the manifold will further be detailed below. The cooling side and heating side manifold bodies 10 and 36 are united with each other in the manner just described above, with the module 7 being disposed at an inner central region of the manifold. The lid 12 is fixed on the cooling side body 10 so as to close the opening of its boss-shaped portion. The shaft holder 11 is set in place in the recess of said boss-shaped portion so that the shaft 13 extends through the holder and the end of said shaft is received in the hole formed in the lid 12.

A cavity 52 is defined by and between a cooling side heat transfer face 50 of the module 7 and the recess 15 of the manifold body's 10 disc-shaped portion. The cooling side agitator 5 fitted in this cavity 52 and having a center supported by the shaft 13 is capable of rotating therearound or therewith.

Similarly to the cooling side, a further cavity 55 is defined by and between a heating side heat transfer face 51 of the module 7 and the recess 38 of the manifold body's 36 disc-shaped portion. The heating side agitator 6 fits in this cavity 55, and the shaft holder similarly extends through the boss-shaped portion's recess 39.

Instead of the lid 12 closing the cooling side manifold body 10, the motor assembly 8 serves to cover the heating side outer face.

In detail, the casing 45 of this assembly 8 is secured to the boss-shaped portion of the heating side manifold body 36 so that the central chamber 47 in the casing accommodates therein the rotor 46. It is to be noted here that a magnetic center line 58 is intentionally offset rearward with respect to that 59 of the stator 48.

A shaft 60 fixed through the rotor 46 extends through the shaft holder 37 to be firmly secured to the heating side agitator 6.

The manifold 1 of the described embodiment discussed above will operate as follows.

Figure 9:
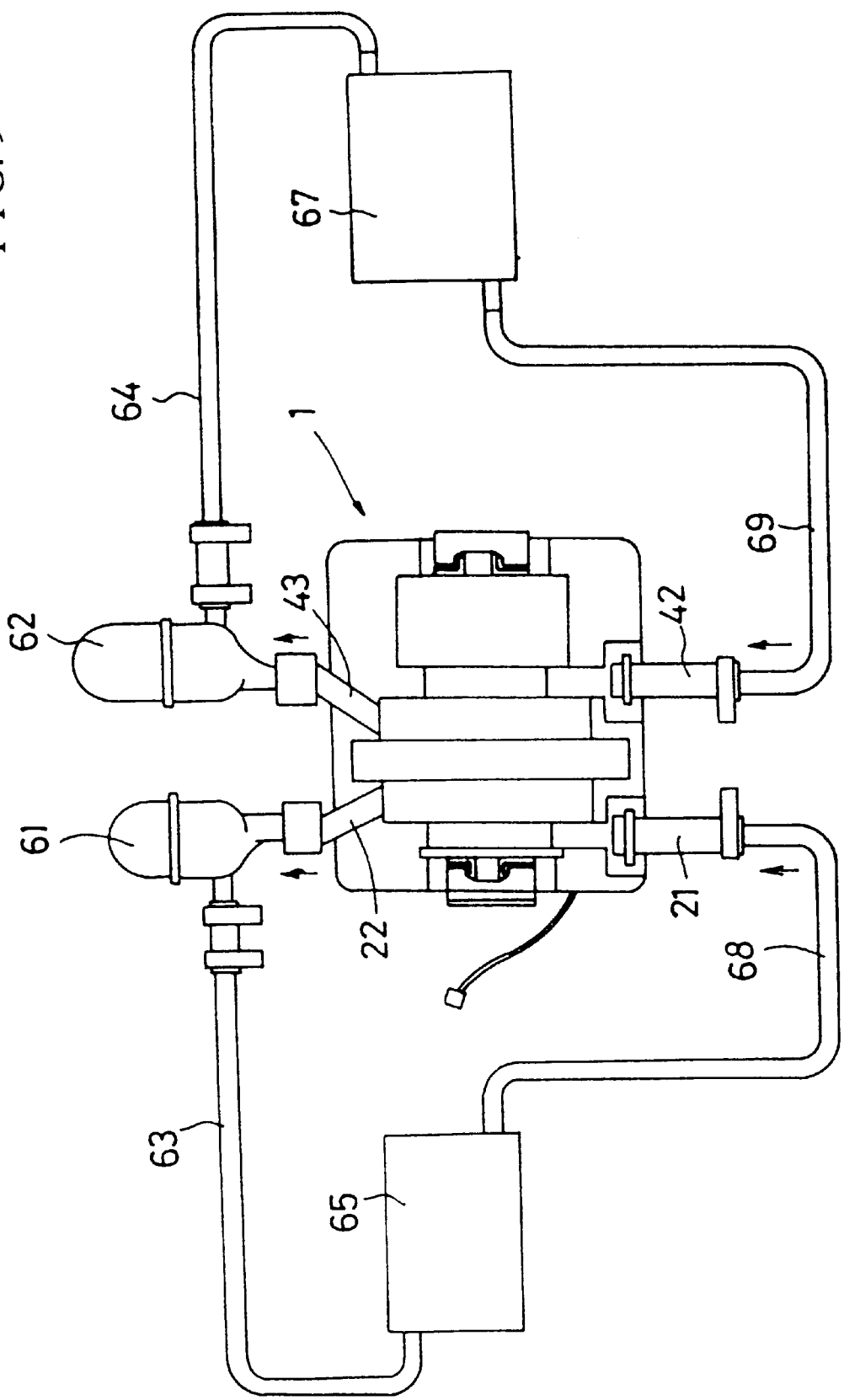
FIG. 9 is a scheme of a cooling apparatus in which the manifold shown in FIG. 1 is utilized.

This manifold 1 may be utilized as a part of such a cooling apparatus as shown in FIG. 9.

The cooling side of the manifold I may be connected by a piping to an evaporator (as one of heat exchangers) 65 suited to absorb heat, whilst the heating side of said manifold is connected to a condenser (as the other heat exchanger) 67 for emitting heat.

The heat transfer faces 50 and 51 of the thermoelectric modules 7 incorporated in the manifold 1 have to be positioned vertically so that the inlets 21 and 42 are located downwards and the outlets 22 and 43 upwards.

Pipes 68 and 69 leading to the manifold 1 will thus be connected to the inlets 21 and 42 on the downside. Other pipes 63 and 64 extending from corresponding air vents 61 and 62 that are attached to the outlets 22 and 43 on the upside will lead to the evaporator 65 and condenser 67, respectively. Outlet ports of those evaporator and condenser are secured to upstream ends of the pipes 68 and 69 mentioned above, thereby forming different and separate closed circuits.

These closed circuits may be filled with water or with an aqueous liquid comprising water as a major ingredient, so as to serve as the heat exchanging media. It is preferable that the medium circulating within the cooling side circuit contains a proper amount of propylene glycol that makes the medium unfreezable. The other medium in the heating side circuit may preferably be water, which has a large specific heat, or alternatively a liquid whose major ingredient is water, though not delimited thereto.

In the example just discussed above, the manifold 1 itself works as a means for urging those liquid media to flow through the circuits, enabling it to dispense with pumps.

The manifold 1 thus prepared ready to run will be started by energizing the module 7 thereof as well as the motor assembly 8.

Consequently, the cooling side face 50 in the thermoelectric module 7 will automatically be cooled, with the heating side face 51 being simultaneously be heated.

The rotor 46 in the motor assembly will start to rotate to drive the heating side agitator 6 to rotate within the heating side cavity 55.

Since the both the agitators 5 and 6 facing one another beyond the thermoelectric module 7 have the magnets 33 attracting one another across said module, the cooling side agitator 5 will be induced to rotate within the cooling side cavity 52.

Thus upon start of the motor assembly 8, kinetic energy imparted to the agitators 5 and 6 will force same to turn within the respective cavities 52 and 55.

Due to inertia thus given to the heat exchanging media, they tend to flow out of those cavities 52 and 55 respectively through the outlets 22 and 43, whereby fresh amounts of said media are sucked into said cavities through the respective inlets 21 and 42. It is noted here that those successive masses of the media entering the manifold 1 in this manner will flow at first into the cylindrical recesses 16 and 39, before arriving at the round recesses 15 and 38 via the bores 20 and 41 while being driven by the agitators 5 and 6 to leave the manifold through the outlets 22 and 43. It is also to be noted that in the heating side, although the heat exchanging medium flows into the boss-shaped portion and then into the chamber 47 of the motor assembly to thereby wet its rotor 46, the latter made substantially of plastics will be protected well from rusting.

As the heat exchanging media are stirred in the cavities 52 and 53, they efficiently contact the heat transfer faces 50 and 51 to enhance heat transfer between them and the latter. In particular in the described embodiment, blades of the agitators 5 and 6 have their front surfaces slanted axially thereof. Thanks to this feature, the media fractions are constantly urged towards the transfer faces 50 and 51 so that such a forced contact thereof with said fractions will furthermore improve heat transfer efficiency.

Always during rotation of those agitators 5 and 6, as the agitators urge the media fractions towards the faces 50 and 51, the agitators receive reactions from the media fractions, thus tending to be biased rearwards. On the other hand, the magnetic center line 58 of the rotor 46 is designed offset rearward relative to that 59 of the stator 48, so that a magnetic force imparted to the turning rotor 46 will force those magnetic center lines 58 and 59 into alignment with each other. Thus, the force biasing the agitators 5 and 6 rearwards is compensated with such a righting moment. In addition, the small lugs 34 formed on the agitators 5 and 6 will bear against the walls of the manifold bodies 10 and 36, whereby these agitators are protected from coming into a frictional close contact with said walls that would prevent said agitators from turning smoothly.

Any bubbles coming into the thermoelectric module 7 will easily ascend along the upright transfer faces 50 and 51 disposed therein, thereby inhibiting those bubbles from hindering good contact of said faces with the heat exchanging media.

SECOND EMBODIMENT

A second embodiment of the present invention will now be discussed in brief, wherein description on those members depicted with the same reference numerals and doing the same function as in the first embodiment will not be repeated hereinafter in the second and succeeding further embodiments.

Figure 10:
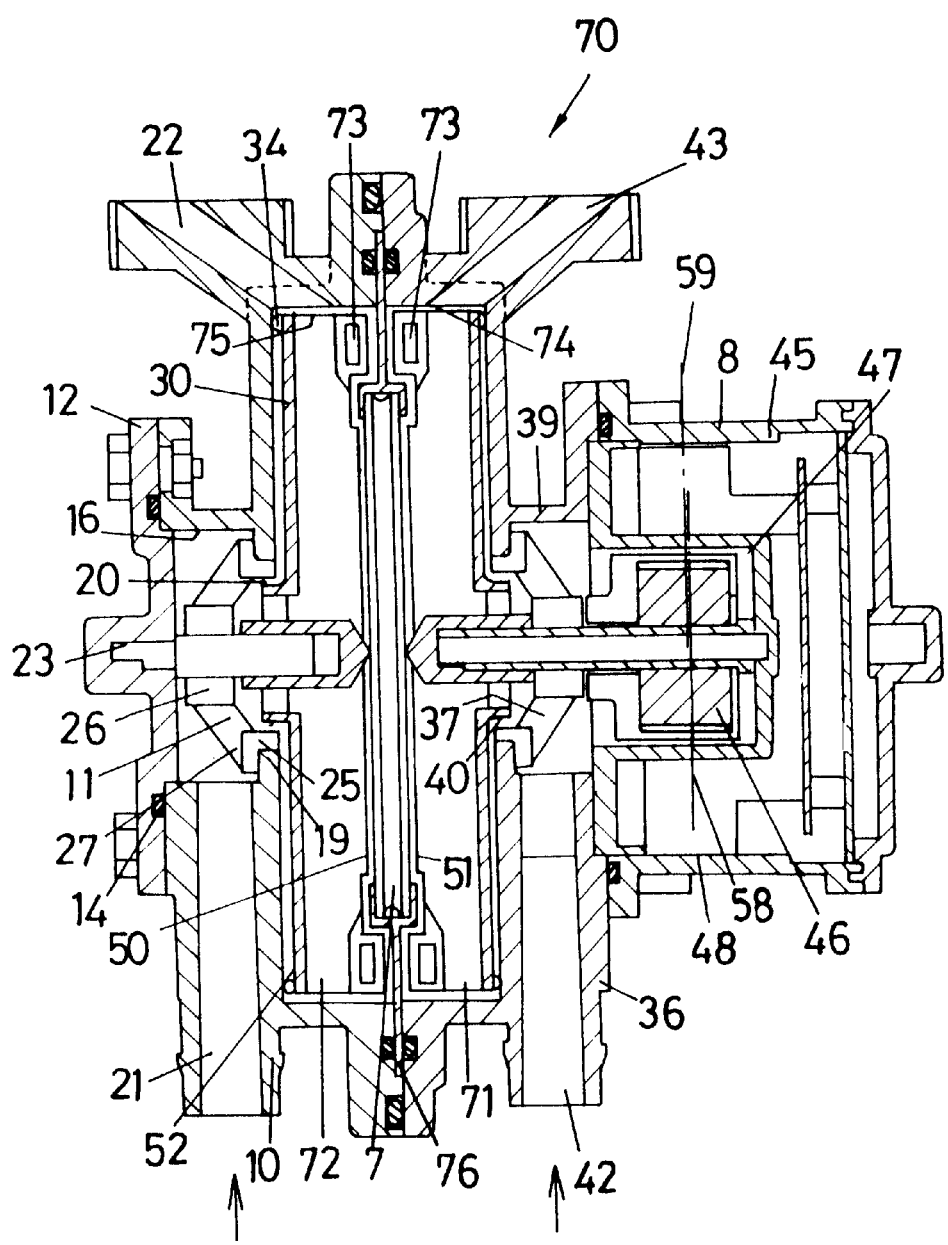
FIG. 10 is a cross-sectional front elevation of a manifold having a built-in thermoelectric module and provided in a second embodiment of the present invention.

FIG. 10 is a cross-sectional front elevation of another manifold provided according to the second embodiment and also has a thermoelectric module secured therein.

Similarly to the first embodiment, this manifold 70 comprises a heating side agitator 71 transmitting its torque to a cooling side one 72. However, magnets 73 are secured to these agitators at different locations than those disposed in the first embodiment.

Cavities 74 and 75 formed in this manifold 70 are each of a vertical area greater than that of the module 7. Although the module in the first embodiment serves as a complete partition that insulates the cavities from each other, the relatively small thermoelectric module in the second embodiment is complemented with a thin and auxiliary annular wall 76 to do so. The magnets 73 are arranged along and outside a periphery of each agitator 71 and 72 and adjacent to the auxiliary wall 76.

This feature protects the thermoelectric module 7 from any adverse influence that might be caused by the magnets 73. A distance between such arrays of magnets facing one another is considerably reduced in this embodiment, so that torque transmission between the agitators 71 and 72 will be more efficient.

THIRD EMBODIMENT

Figure 11:
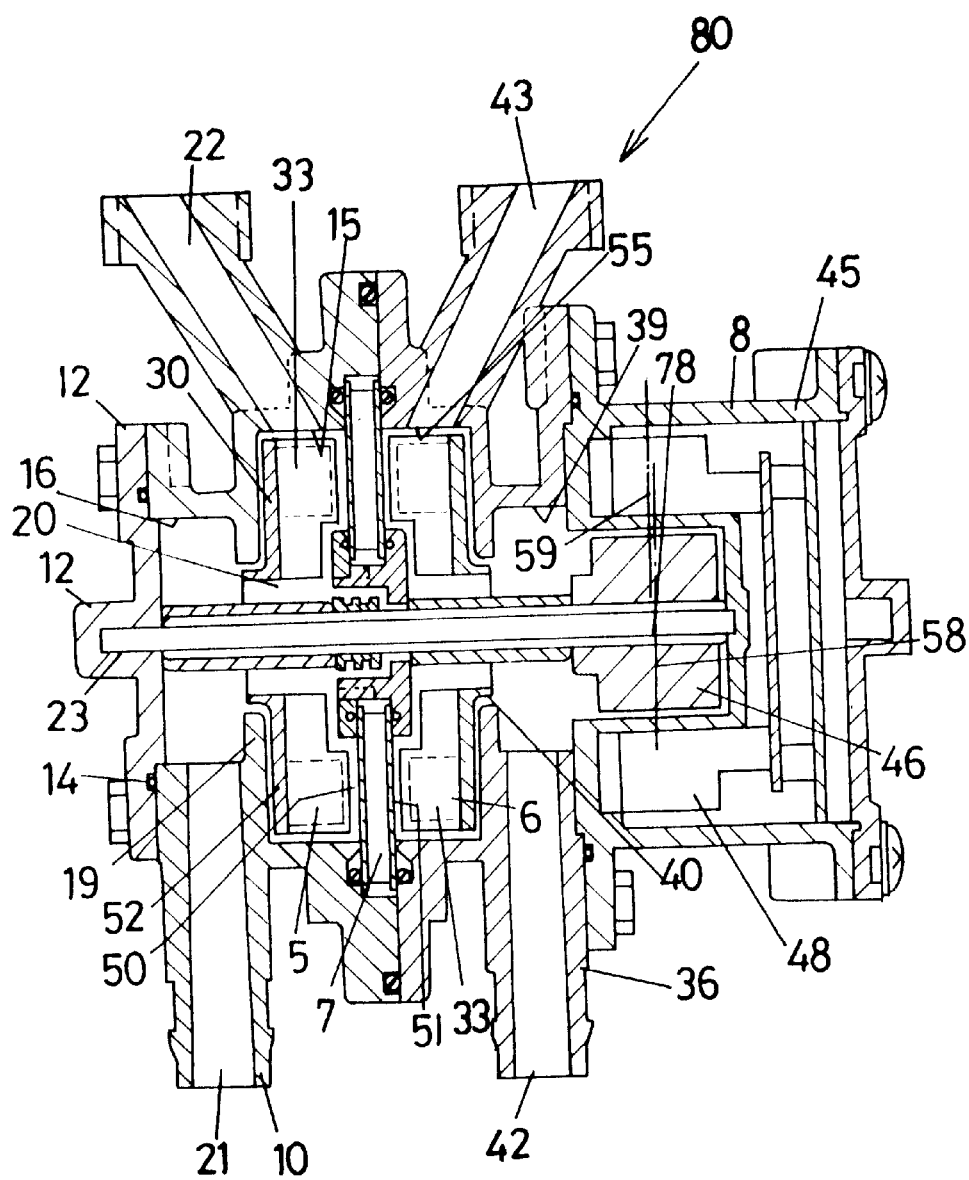
FIG. 11 is likewise a cross-sectional front elevation of a manifold having a built-in thermoelectric module and provided in a third embodiment of the present invention.

Next, a third embodiment will be described referring to FIG. 11 that is a cross-sectional front elevation of a manifold, which likewise comprises a set-in thermoelectric module.

Whereas the two preceding embodiments utilize magnetic force, a shaft 78 is equipped in this third embodiment to transmit torque between the agitators 5 and 6.

In detail, the manifold 80 has an elongate shaft 78 that is fixed in and through the rotor 46 and penetrates the module 7. This shaft 78 extending into the cooling side cavity 52 is fixedly connected to the agitator 5 disposed therein, thereby making it possible to directly drive it along with the other agitator 6 of the heating side.

FOURTH EMBODIMENT

Figure 12:
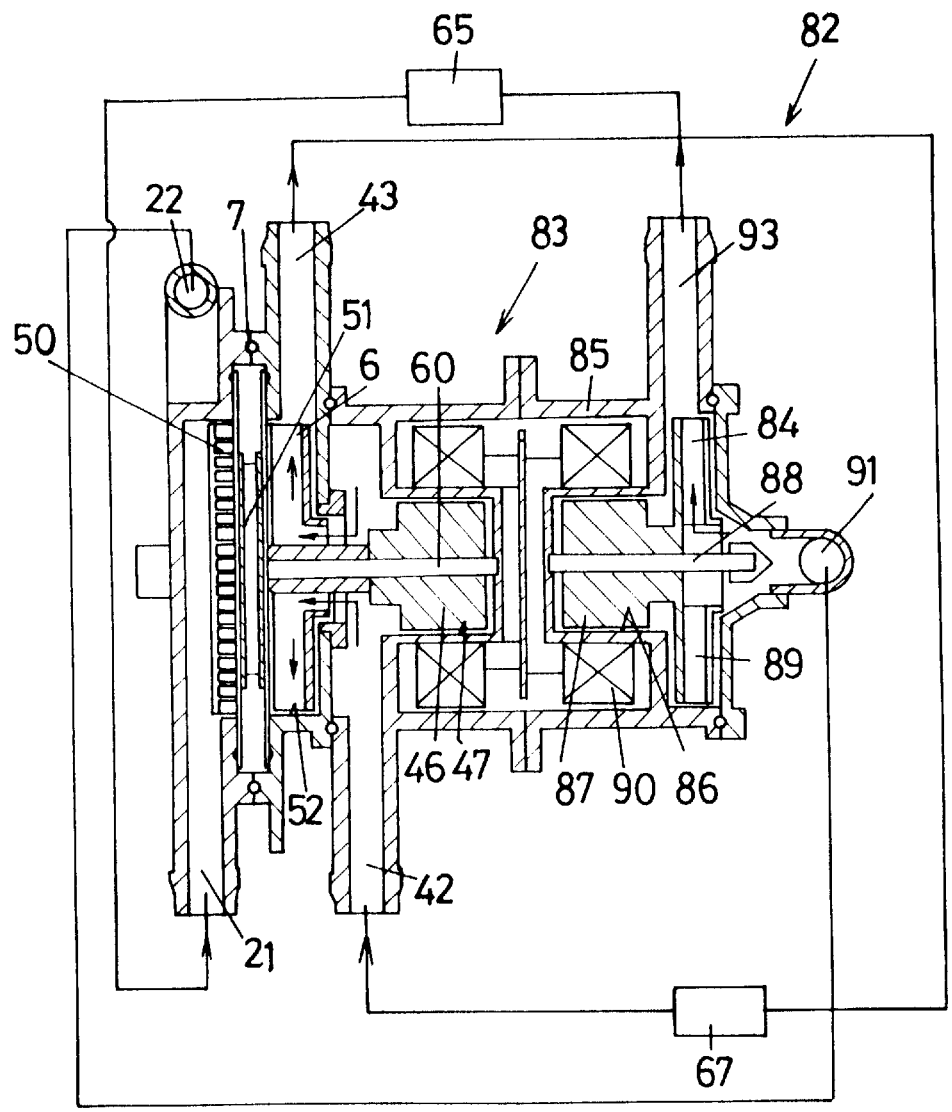
FIG. 12 is also a cross-sectional front elevation of a manifold having a built-in thermoelectric module and provided in a fourth embodiment of the present invention.

A fourth embodiment will be described referring to FIG. 12 that is a cross-sectional front elevation of a still another manifold comprising a built-in thermoelectric module.

All of the three preceding embodiments employ two agitators accommodated in the heating and cooling cavities, respectively, and the single motor assembly works to drive both the heating and cooling side agitators. In contrast with such a structure, the manifold 82 in the fourth embodiment a motor assembly 83 drives the heating side agitator 6 and an internal pump 84.

The pump 84 is integral with a rear portion of the motor assembly 83 built in the manifold 82 of the present embodiment. A casing 85 of said motor assembly has an additional core chamber 86 located at the rear portion so as to receive an additional rotor 87. The additional core chamber 86 is separated from the above mentioned chamber 47 located in front of the additional one.

A shaft 88 for the rotor 87 is disposed in alignment with the shaft 60 for the rotor 46, and operatively connected to a blade assembly 89 of the internal pump 84.

A stator 90 placed in the casing 85 and extending along the rotors 46 and 87 is of a length sufficient to surround both the rotors. Thus, one stator 90 and two rotors 46 and 87 constitute the motor assembly in this case.

By switching on the stator 90 existing in the manifold 82 with the built-in module of this embodiment, the two rotors 46 and 87 will start to rotate to drive in turn the agitator 6 and the blade assembly 89 of the pump 84.

To construct a cooling apparatus using the manifold 82, the condenser 67 may be set in a heating side closed circuit to communicate with the outlet 43 on one hand and with the inlet 42 on the other hand, similarly to the circuit described above. The internal pump 84 having a suction port 91 and a delivery port 93 will however be incorporated in a cooling side circuit, in the following manner. Namely, the outlet 22 communicates with the suction port 91 through a piping so that the medium effluent from the delivery port 93 returns through the evaporator 65 to the inlet 42.

The inlets 21 and 42 of the manifold 82 of this embodiment are also disposed downwards, with the outlets 22 and 43 obliquely facing upwards, as is in the above described embodiments.

FIFTH EMBODIMENT

Figure 13:
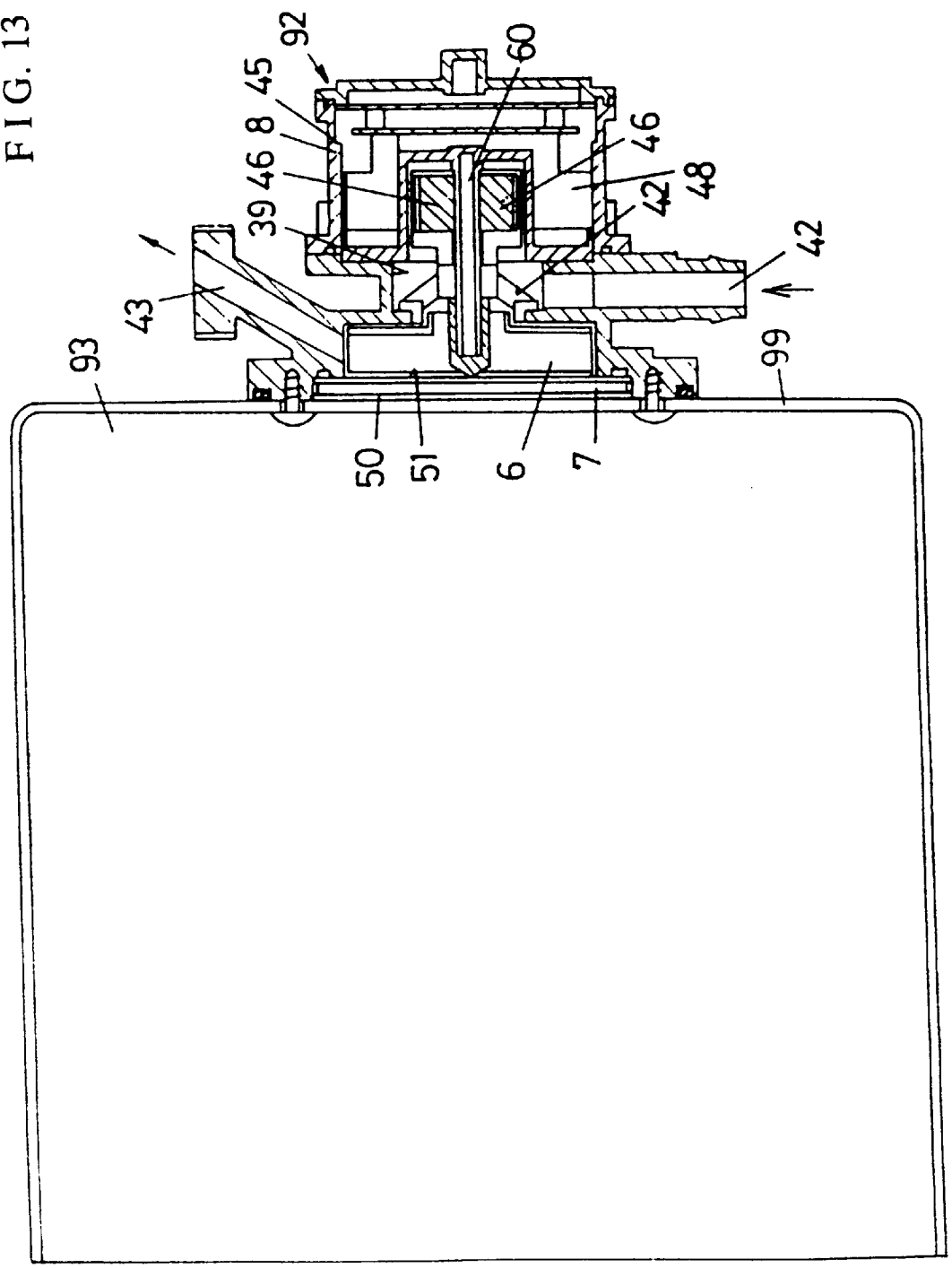
FIG. 13 is similarly a cross-sectional front elevation of a manifold having a built-in thermoelectric module and provided in a first embodiment of the present invention.

A fifth embodiment is illustrated in FIG. 13, which also is a cross-sectional front elevation of a further manifold.

This manifold of the sixth embodiment is peculiar in that its single inlet 42 takes a lower position and its single outlet 43 takes an upper oblique position, in common with a sixth embodiment discussed below.

As will be seen in FIG. 13, the manifold 92 covers only the heating side of the thermoelectric module and no manifold section is provided for the cooling side. The cooling side heat transfer face 50 of this module is fixed on a wall 99 (viz., conductive plate) of a box-shaped container or the like 93, such that said face and said wall are kept in direct and close contact with each other. Such a manifold may cooperate with the box-shaped container, allowing the latter to hold any articles to be cooled therein as in a refrigerator.

SIXTH EMBODIMENT

Figure 14:
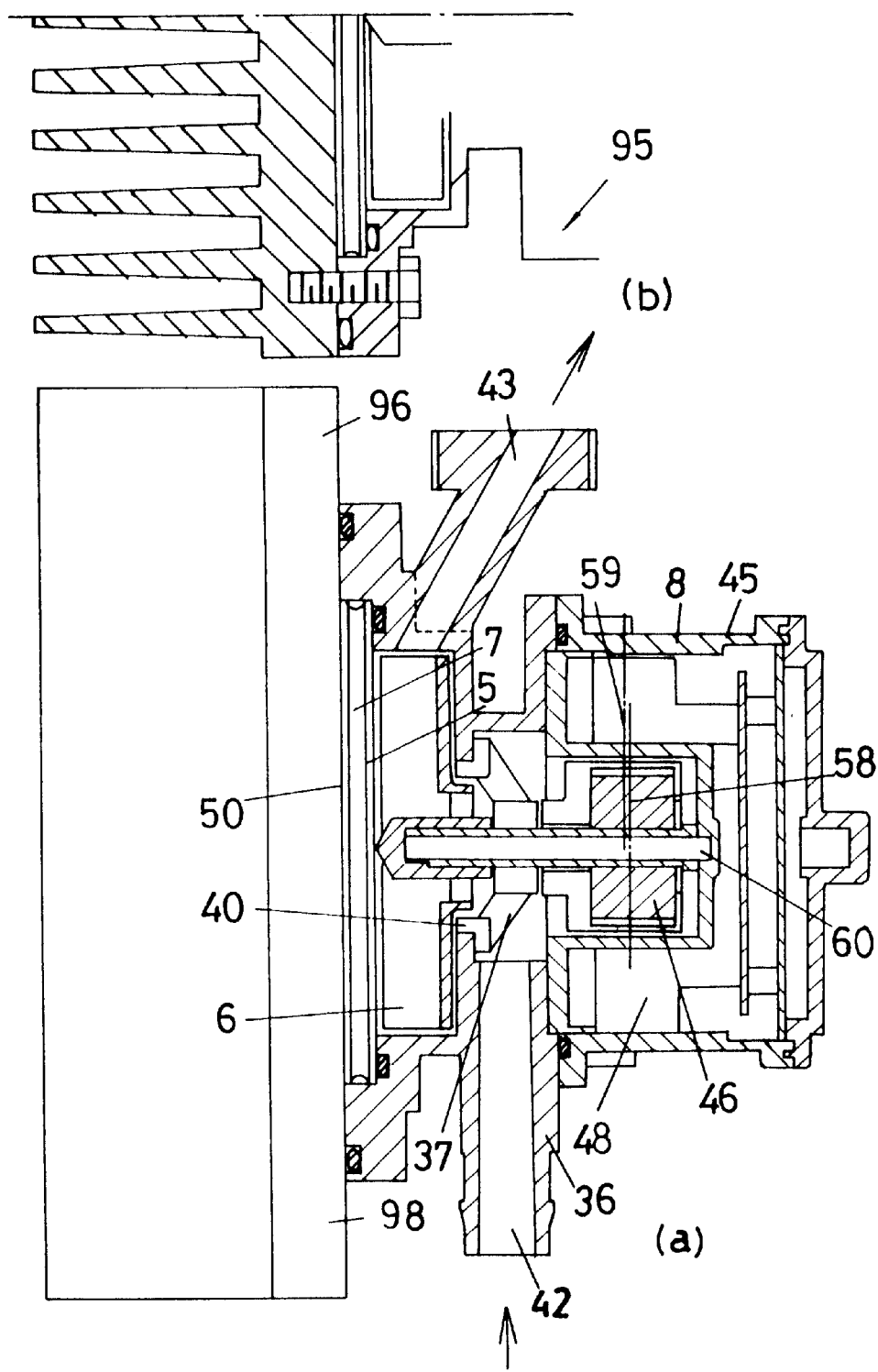
FIG. 14(a) is a cross-sectional front elevation of a manifold having a built-in thermoelectric module and provided in a sixth embodiment of the present invention.
FIG. 14(b) is a cross-sectional plan view of the manifold shown in FIG. 14(a)

A sixth embodiment is illustrated in FIG. 14, which also is a cross-sectional front elevation of a still further manifold.

This manifold also corresponds only to the heating side. The cooling side heat transfer face 50 of the module directly and closely contacts a wall (conductive plate) 98 of a fin member 96, that may be used to cool air in a refrigerator.

SEVENTH EMBODIMENT

Figure 15:
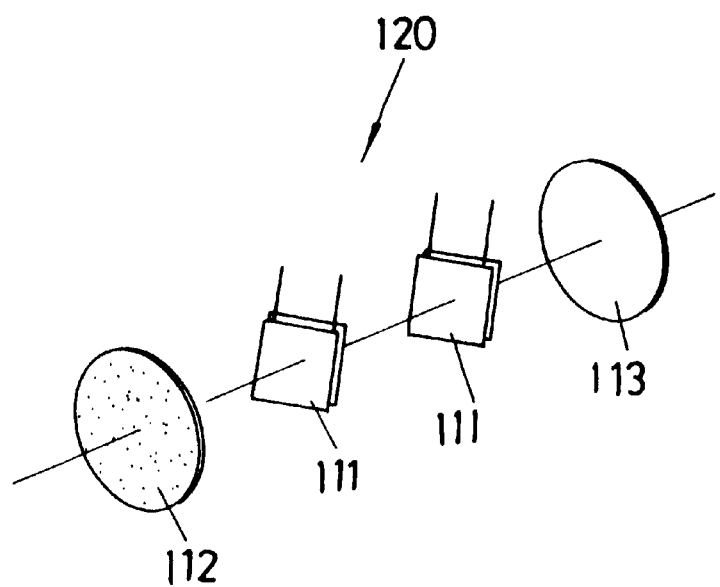
FIG. 15 is an exploded perspective view of a manifold having a built-in thermoelectric module and provided in a seventh embodiment of the present invention.

Next, a seventh embodiment will be described with reference to FIG. 15. The seventh and succeeding embodiments differ from the first embodiment only in a thermoelectric module 120. Description of the structural features of the manifold will not be repeated, because they are the same as those of the first embodiment. The same reference numerals are allotted to the same elements as those which have been discussed in relation to the module in the foregoing embodiments, also avoiding repetition.

As already mentioned above and shown in FIG. 5, the module 7 in the first embodiment consists of one rectangular thermoelectric element 111 of a square shape sandwiched by and between aluminum discs 112 and 113. however, the module 120 in the present embodiment consists of two such elements 111 of the thermoelectric property and sandwiched between the two discs 112 and 113. The two elements 111 in this case are piled one on another.

As the elements 111 are piled in the module 120 in this embodiment, the module can produce much lower temperatures. Therefore the manifold containing the module therein can cool articles to much lower temperatures.

It will be understood that the module provided in this embodiment may also be used in any of the manifolds of the second to sixth embodiments.

EIGHTH EMBODIMENT

Figure 16:
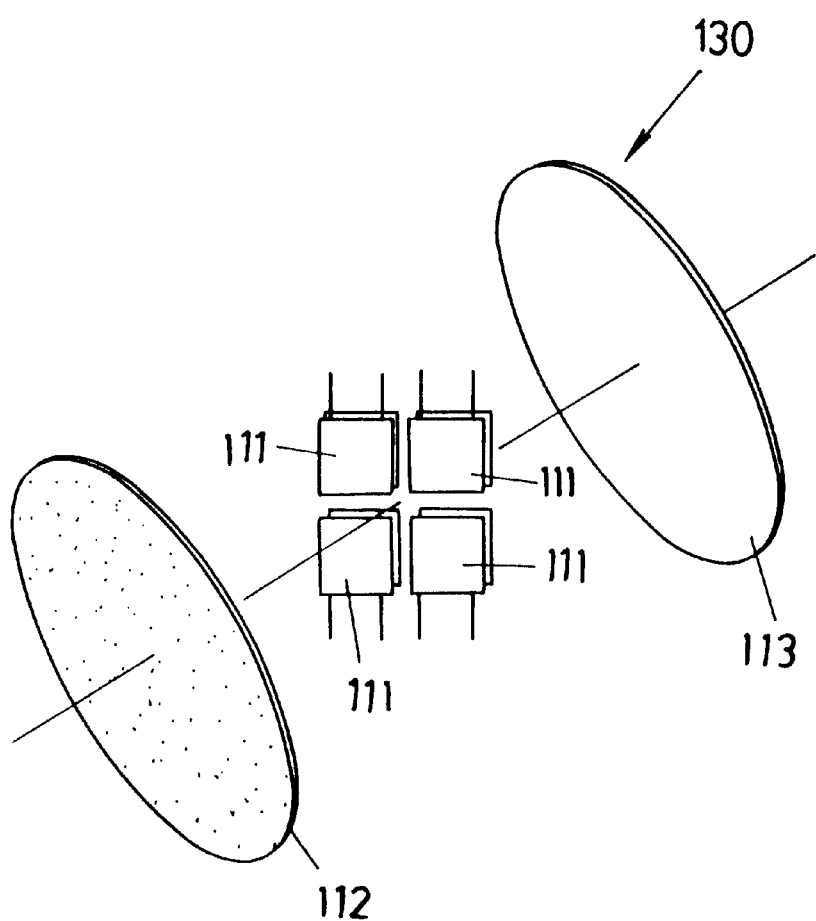
FIG. 16 is an exploded perspective view of a manifold having a built-in thermoelectric module and provided in an eighth embodiment of the present invention.
Figure 20:
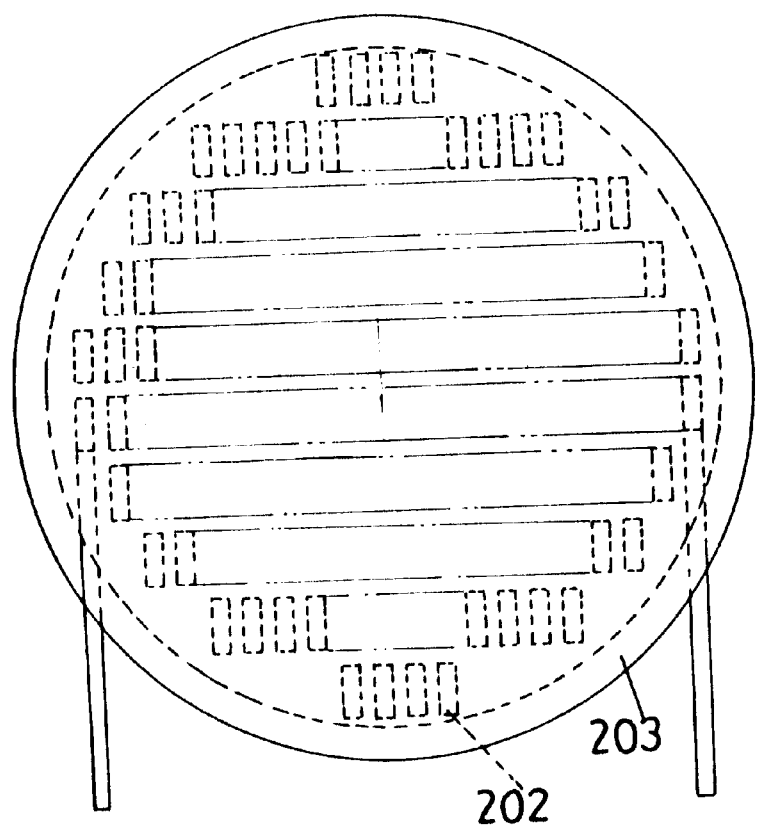
FIG. 20 is a front elevation of the prior art circular thermoelectric module disclosed in the international application No. "PCT/AU/00271"
Figure 21:
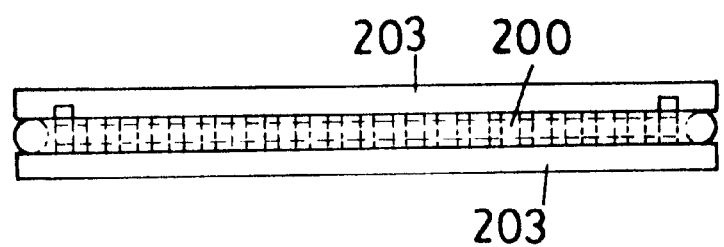
FIG. 21 is a cross section of the module shown in FIG. 20.

FIGS. 16 and 17 show an eighth embodiment.

Another thermoelectric module 130 in this embodiment consists of an array of four elements 111. These elements are arranged in a 'four squares' pattern (i.e., a matrix of two rows and two lines) on a common plane and also sandwiched between the discs 112 and 113.

This module 130 thus has an increased circular area, by virtue of those elements disposed side by side.

Any manifold provided in any of the second to sixth embodiments may also employ this module 130.

NINTH EMBODIMENT

In a further module 140 provided in a ninth embodiment shown in FIG. 18, three elements 111 included in one common plane are set in place by simply removing one square out of the 'four squares' pattern.

This module 140 may also be incorporated in any of the manifolds provided in the second to sixth embodiments.

TENTH EMBODIMENT

FIGS. 19(a) and 19(b) show a tenth embodiment.

The number of thermoelectric elements 111 included in one module is eight, wherein four of them form a layer stacked on another layer consisting of the remainder.

Such a double-strata structure of this module 150 further comprises three discs 112, 151 and 113. Each of the outer discs 112 and 113 has rough surfaces, with the inner or middle one 151 having smooth surfaces.

Secured between the one outer disc 112 and the middle disc 151 are a first 'four squares' planer array of the elements 111, and likewise secured between the middle disc 151 and the other outer one 113 are a second such array of said elements. These arrays are offset relative to each other, with an angular shift of 45 (forty-five degrees).

Therefore, the thermoelectric module 150 not only have an enlarged circular area but also affords much lower temperatures.

This module 150 may also be combined with any manifold structure proposed in the second to sixth embodiments.

In summary, each manifold provided herein comprises a thermoelectric module whose heat transfer faces are disposed vertically and confronting the cavities. Any bubbles appearing in the cavities will easily and quickly ascend along the heat transfer faces and move away from the module, entering the outlets disposed above the cavities. Consequently, bubbles will never prevent good contact of the faces with the media, not failing to ensure a high efficiency of heat exchange.

The slanted and upward-facing outlets of the manifold will assist the bubbles to smoothly flow away, entrained in the streams of said heat exchanging media.

The agitators fitted in the cavities will produce therein the swirls of the heat exchanging media in the same angular direction of said agitators, also improving contact of the module's faces with said media to further enhance the efficiency of heat exchange.

Advantageously, the single stator and the two rotors constitute the motor assembly in the manifold with the built-in thermoelectric module. Thus, the agitator within the cavity as well as the blade assembly within the internal pump are rotated by said motor assembly without necessitating any additional or external pump. Consequently, the number of necessary parts is reduced.

Also advantageously, one of the agitators transmit its torque to the other one so that a single driving source can drive both the agitators at the same time. Consequently, the number of necessary parts is reduced and the manifold as a whole is rendered smaller-sized.

This feature is more prominent in a structure that the cavities formed in the manifold respectively accommodate the agitators, whereby the single driving source effectively puts both the agitators separately held in said cavities into simultaneous rotation, notwithstanding the reduced number of parts and the compactness of said manifold.

Magnetic force is utilized to transmit torque between the agitators not contacting one another, thus enabling the cavities to be insulated from each other so as to inhibit the heating side medium from mixing with the cooling side one.

In one of the also preferable modes, the cavities are of a diameter greater than that of thermoelectric module such that the magnets fixed on the agitators are arranged along and outside the periphery of said module, to thereby protect the latter from any adverse magnetic influence.

In another mode, the shaft fixed through one of the agitators may directly drive the other also in an efficient manner.

In any case, the thermoelectric module incorporated in each type of the manifolds is round in side elevation, thereby diminishing idle area of the manifold.

Square elements constituting the module in the present invention are consolidated such as to render the module round-shaped.

In still another preferable mode the heat transfer face of the module is set in a direct and close contact with a heat-emitting plate, thereby making it possible to directly cool ambient air or any articles placed in the vicinity of said plate.

In the cooling apparatus provided herein, each cavity itself performs like as a kind of pump so that any additional pumps of the conventional types can be dispensed with.

Round thermoelectric modules are realized and they are readily manufactured. Also the multiplication of Peltier elements has become easy. Such round modules have a larger surface area effective to transfer heat.

Square thermoelectric elements stacked one on another between discs of one module will form a multi-strata structure suited to produce much lower temperatures.

The array of those elements disposed between the discs and arranged side by side in each stratum will give the module a larger area for heat transfer.

In still another preferable mode, the discs are of a rough outer surface, thereby enhancing efficiency of heat exchange.

UTILIZEABILITY IN THE INDUSTRIES

The manifold having a built-in thermoelectric module as well as the cooling apparatus employing the module may be used not only as a freezer that plays a principal role in any refrigerator but also as a cooling device in any air conditioner or chiller.

What is claimed is:

1. A manifold comprising: a built-in thermoelectric module that has at least two heat transfer faces such that one of the faces is heated and the other face is cooled when an electric current is applied to the module, a manifold body covering the module to define a first cavity beside the heated face of said module and within the body and to define a second cavity beside the cooled face; agitators in the respective cavities; a driving means for rotating one of the agitators; and a transmission for transmitting torque of the one agitator to the other agitator so that the one agitator is driven within the first cavity, the other agitator receiving torque from the one agitator so as to rotate within the second cavity.

2. A manifold as defined in claim 1, wherein transmission of force between the agitators relies on a magnetic mechanism.

3. A manifold as defined in claim 2, wherein outer dimensions of the cavities are greater than those of the module's heat transfer faces so that magnetic pieces constituting the magnetic transmission mechanism are fixed on agitators' regions confronting the portion along and outside the periphery of the module.

4. A manifold as defined in claim 1, wherein a common shaft penetrates both the cavities so that torque of one agitator is transmitted by and through this shaft to the other agitator.

5. A manifold as defined in claim 1, wherein the manifold body has an inlet for causing a heat exchanging medium to flow into at least one of the cavities, and an outlet for causing the medium to flow out of this cavity, and wherein the heat transfer faces are disposed vertically so that the outlet is disposed at an uppermost portion of said cavity.

6. A manifold as defined in claim 5, wherein the outlet protrudes upwards and obliquely.

7. A manifold as defined in claim 1, wherein the thermoelectric module is of a circular contour.

8. A manifold as defined in claim 1, wherein the module comprises an element molded as a plate and sandwiched between a pair of heat conductive discs.

9. A manifold as defined in claim 7, wherein at least one rectangular thermoelectric element is sandwiched by and between two or more discs to provide the module, wherein a plurality of Peltier elements are arranged and fixed in position to form said rectangular thermoelectric element.

10. A manifold as defined in claim 9, wherein the thermoelectric element is sandwiched between the discs that are layers of a substance selected from the group consisting of ceramics and aluminum oxide.

11. A manifold as defined in claim 9, wherein the thermoelectric elements are stacked one on another between the discs.

12. A manifold as defined in claim 9, wherein the thermoelectric elements are arranged side by side between the discs.

13. A manifold as defined in claim 9, wherein the discs are each of a roughened outer surface.

14. A manifold as defined in claim 1, wherein the driving means is a motor assembly comprising a rotor and a stator and the rotor is connected to one of the agitators such that magnetic center line of the rotor is offset relative to magnetic center line of the stator, and the former center line is deviated rearwardly of center lines of the agitators.

15. A manifold comprising: a built-in thermoelectric module that has at least two heat transfer faces such that one of the faces is heated and the other face is cooled when an electric current is applied to the module, a manifold body covering the heat transfer faces and defining a first cavity between the one face and the body and a second cavity between the other face and the body; a first agitator disposed in the one cavity and having a first shaft; an internal pump accompanied by the manifold and having a second agitator disposed in the second cavity and a second shaft, with the shafts extending in alignment with each other; rotors respectively connected to the agitators; and a single stator surrounding both rotors so that the stator and the rotors form a motor assembly capable of rotating the first agitator in the first cavity together with the second agitator of the pump.

16. A manifold as defined in claim 1 5, further comprising a transmission for transmitting torque of the one agitator in the first cavity so as to rotate them within the respective cavities.

17. A manifold as defined in claim 16, wherein transmission of force between the agitators relies on a magnetic mechanism.

18. A manifold as defined in claim 16, wherein outer dimension of the cavities is greater than that of the module's heat transfer faces so that magnetic pieces constituting the magnetic transmission mechanism are fixed on agitators' regions confronting the portion along and outside the periphery of the module.

19. A manifold as defined in claim 16, wherein a common shaft penetrates both the cavities so that torque of one agitator is transmitted by and through this shaft to the other agitator.

20. A manifold as defined in claim 15, wherein the manifold body has an inlet for causing a heat exchanging medium to flow into at least one of the cavities, and an outlet for causing the medium to flow out of this cavity, and wherein the heat transfer faces are disposed vertically so that the outlet is disposed at an uppermost portion of said cavity.

21. A manifold as defined in claim 20, wherein the outlet protrudes upwards and obliquely.

22. A manifold as defined in claim 15, wherein the thermoelectric module is of a circular contour.

23. A manifold as defined in claim 15, wherein the module comprises an element molded as a plate and sandwiched between a pair of heat conductive discs.

24. A manifold as defined in claim 15, wherein a plurality of rectangular Peltier elements are arranged and fixed in position to form a rectangular group of them, and sandwiched by and between two or more discs to provide the module.

25. A manifold as defined in claim 24, wherein the Peltier elements are sandwiched between the discs that are layers of a substance selected from the group consisting of ceramics and aluminum oxide.

26. A manifold as defined in claim 24, wherein the Peltier elements are stacked one on another between the discs.

27. A manifold as defined in claim 24, wherein the Peltier elements are arranged side by side between the discs.

28. A manifold as defined in claim 22, wherein the discs are each of a roughened outer surface.

29. A manifold as defined in claim 15, wherein the manifold body covers only one of the heat transfer faces, with the other face of the module being in close contact with a heat conducting plate.

30. A manifold comprising: a built-in thermoelectric module that has at least two heat transfer faces such that one of the faces is heated and the other face is cooled when an electric current is applied to the module; a manifold body covering the heat transfer faces and defining a first cavity between the one face and the body and a second cavity between the other face and the body; agitators disposed in said cavities and adapted to rotate therein; a medium inlet through which a heat exchanging medium flows into the one cavity, and a medium outlet through which the medium flows out of said one cavity, wherein the heat transfer faces of the thermoelectric module stand upright and the medium outlet is disposed in and protrudes from an upper region of the one cavity.

31. A manifold as defined in claim 30, wherein the medium outlet is slanted and facing upwards.

32. A manifold as defined in claim 30, wherein the manifold body covers the thermoelectric module such that one cavity is provided beside the heated face of said module and within the body, with the other cavity likewise provided beside the cooled face, and wherein the agitators are installed in the respective cavities, and a magnetic transmission is provided for them to transmit torque of the one agitator in the one cavity to the other agitator in the other cavity so as to rotate them within the respective cavities.

33. A manifold as defined in claim 30, wherein the manifold body covers the thermoelectric module such that one cavity is provided beside the heated face of said module and within the body, with the other cavity likewise provided beside the cooled face, and wherein the agitators are installed in the respective cavities, and a shaft extends from the one cavity to the other cavity so as to transmit torque of the one agitator in the one cavity to the other agitator in the other cavity, whereby both the agitators are driven to rotate within the respective cavities.

34. A manifold as defined in claim 30, wherein the thermoelectric module is of a circular contour.

35. A manifold as defined in claim 30, wherein the module comprises an element molded as a plate and sandwiched between a pair of heat conductive discs.

36. A manifold as defined in claim 30, wherein at least one rectangular thermoelectric element is sandwiched by and between two or more discs to provide the module, wherein a plurality of Peltier elements are arranged and fixed in position to form said rectangular thermoelectric element.

37. A manifold as defined in claim 36 wherein the thermoelectric elements are sandwiched between the discs that are layers of a substance selected from the group consisting of ceramics and aluminum oxide.

38. A manifold as defined in claim 36, wherein the thermoelectric elements are stacked one on another between the discs.

39. A manifold as defined in claim 36, wherein the thermoelectric elements are arranged side by side between the discs.

40. A manifold as defined in claim 34, wherein the discs are each of a roughened outer surface.

41. A manifold as defined in claim 30, wherein the manifold body covers only one of the heat transfer faces, with the other face of the module being in close contact with a heat conducting plate.

42. A thermoelectric module of a round shape wherein at least one rectangular thermoelectric element is sandwiched by and between two or more discs to provide the module, wherein a plurality of Peltier elements are fixed to position to form said rectangular thermoelectric element, wherein the Peltier elements are sandwiched between layers of a substance selected from the group consisting of ceramics and aluminum oxide to form the thermoelectric element.

43. A thermoelectric module as defined in claim 42, wherein the thermoelectric elements are stacked one on another between the discs.

44. A thermoelectric module as defined in claim 42, wherein the thermoelectric elements are arranged side by side between the discs.

45. A thermoelectric module as defined in claim 42, wherein the discs are each of a roughened outer surface.

46. A manifold having a built-in thermoelectric module and comprising: a plurality of thermoelectric elements arranged to draw a rectangular contour and sandwiched between discs so as to give the module a generally round appearance, the round module having two heat transfer faces such that one of the faces is heated and the other face is cooled when an electric current is applied to the module; a manifold body covering the module so that one cavity is formed beside the heated face of said module and within the body and another cavity is formed beside the cooled face, the manifold body having a medium inlet through which the medium flows into each cavity as well as a medium outlet through which the medium flows out of each cavity, wherein the heat transfer faces of the thermoelectric module stand upright and the medium outlet is disposed in an upper region of the cavity; agitators in each cavity; a transmission for magnetically transmitting torque of the one agitator to the other agitator; a pump secured to the manifold body and having a further agitator with a shaft in alignment with a further shaft of the agitator; separate rotors connected to the agitator in the cavity and to the agitator of the pump; and a stator surrounding both the rotors so that the stator and the rotors form a motor and when the agitator in one cavity as well as the agitator of the pump is driven the other agitator in the other cavity magnetically receives torque from the one agitator thus rotating within the other cavity.

47. A cooling apparatus comprising a manifold having a built-in thermoelectric module, a piping and at least one external heat exchanger communicating with the module through the piping, wherein the manifold comprises at least two heat transfer faces such that one of the faces is heated and the other face is cooled when an electric current is applied to the module, a manifold body covering the module so that one cavity is formed beside the heated face of said module and within the body and another cavity is formed beside the cooled face, agitators installed in the respective cavities, a driving means for rotating one of the agitators, and a transmission for transmitting torque of the one agitator to the other agitator so that as the one agitator is driven within the one cavity, the other agitator receives torque from the one agitator and rotates within the other cavity, and the agitators force the heat exchanging medium in the manifold to flow into and circulate through the piping.

48. A cooling apparatus comprising a manifold having a built-in thermoelectric module, a piping and at least one external heat exchanger communicating with the module through the piping, wherein the manifold has at least two heat transfer faces such that one of the faces is heated and the other face is cooled when an electric current is applied to the module, a manifold body covering one of the heat transfer faces to define a first cavity between the one face and the body and covering the other heat transfer face to define a second cavity between the other face and the body, a first agitator disposed in the first cavity and having a first shaft, a pump accompanied by the manifold and having a second agitator and a second shaft, with the shafts extending in alignment with each other, rotors respectively connected to the agitators, and a single stator surrounding both the rotors so that the stator and the rotors form a motor capable of rotating the first agitator in the cavity together with the second agitator of the pump.

49. A cooling apparatus comprising a manifold that has a built-in thermoelectric module, a piping and at least one external heat exchanger communicating with the module through the piping, wherein the manifold has at least two heat transfer faces such that one of the faces is heated and the other face is cooled when an electric current is applied to the module, a manifold body covering at least one of the heat transfer faces and defining a cavity between the one face and the body, a medium inlet through which a heat exchanging medium flows into the cavity, a medium outlet through which the medium flows out of said cavity, and an agitator disposed in the cavity, wherein the heat transfer faces of the thermoelectric module stand upright and the medium outlet is disposed in an upper region of the cavity.

* * * * *